(12) United States Patent
Furukawa

(10) Patent No.: US 7,771,897 B2
(45) Date of Patent: Aug. 10, 2010

(54) PHOTOMASK FOR FORMING A RESIST PATTERN AND MANUFACTURING METHOD THEREOF, AND RESIST-PATTERN FORMING METHOD USING THE PHOTOMASK

(75) Inventor: Takamitsu Furukawa, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 567 days.

(21) Appl. No.: 11/717,694

(22) Filed: Mar. 14, 2007

(65) Prior Publication Data
US 2007/0224521 A1 Sep. 27, 2007

(30) Foreign Application Priority Data
Mar. 22, 2006 (JP) .............................. 2006-079413

(51) Int. Cl.
*G03F 1/00* (2006.01)
*G03F 9/00* (2006.01)
*G03C 5/00* (2006.01)
*G06F 17/50* (2006.01)

(52) U.S. Cl. ................. 430/5; 430/30; 430/22; 716/20

(58) Field of Classification Search ................... 430/5, 430/22, 30, 325; 716/20
See application file for complete search history.

(56) References Cited

U.S. PATENT DOCUMENTS

| 6,828,068 B2 * | 12/2004 | Progler et al. ................. 430/5 |
| 2005/0130045 A1 * | 6/2005 | Ozawa ........................ 430/5 |

FOREIGN PATENT DOCUMENTS

| JP | 08-166666 | 6/1996 |
| JP | 2003 177507 | 6/2003 |

* cited by examiner

*Primary Examiner*—Mark F Huff
*Assistant Examiner*—Jonathan Jelsma
(74) *Attorney, Agent, or Firm*—Volentine & Whitt, P.L.L.C.

(57) ABSTRACT

A method includes; a step of setting square mask cells in rows and columns on a transparent mask-substrate surface by demarcating by orthogonal lines of equal intervals, each of which has one side having a length smaller than a resolution limit of an optical system; a step of setting the resist thicknesses corresponding to the mask cells; a step of assigning normalized light-intensities respectively to the mask cells as transmission intensities, corresponding to the film thicknesses and having three or more different values; a step of setting each of the mask cells a light-transmission area and a shade-area and determining a transmission-light intensity by an transmission area ratio; a step of providing shade films on the shade areas of the mask substrate.

10 Claims, 19 Drawing Sheets

10: PHOTOMASK
40: MASK CELL
46: VIRTUAL GRID LINE
20: MASK SUBSTRATE
42: SHADE AREA
48: VIRTUAL DIVISIONAL LINE
30: SHADE FILM
44: LIGHT-TRANSMISSION AREA

RESIST-PATTERN FORM USING POSITIVE RESIST-1

MASK PATTERN ARRANGEMENT USING POSITIVE RESIST-2

RESIST-PATTERN FORM USING POSITIVE RESIST-2

LENS AND TARGET RESIST FORM

RESIST-FILM THICKNESS BY ONCE EXPOSURE

AVERAGE LIGHT INTENSITIES BY ONCE AND DOUBLE EXPOSURES

RESIST-FILM THICKNESS BY QUADRUPLE-EXPOSURE

RESIST-FILM THICKNESS IN UNITS OF SUB-RESIST-CELL

PREPARATORY CELL INTENSITIES OF
FIRST TO FOURTH PHOTOMASKS

PREPARATORY CELL INTENSITIES OF UNIFIED
FIRST TO FOURTH PHOTOMASKS

LIGHT INTENSITY DUE TO ONCE EXPOSURE AND AVERAGE LIGHT INTENSITY OF DOUBLE-EXPOSURE USING TWO PHOTOMASKS

LIGHT INTENSITY CORRECTION METHOD

CORRECTED PREPARATORY CELL INTENSITIES
OF FIRST TO FOURTH PHOTOMASKS 0.40
0.30
0.20
0.10
0

RESIST-PATTERN FORM AND RESIST-PATTERN FILM
THICKNESS VARIATION, IN EXPOSURE FIELD

52: SHADE AREA
54: LIGHT-TRANSMISSION AREA

TEST PATTERN A

12: ON-MASK REFERENCE POINT
70: RESIST LAYER
82: LENS
60: UNDERLYING LAYER
72: ON-RESIST REFERENCE POINT

DOUBLE-EXPOSURE

PHOTOMASK FOR FORMING A RESIST PATTERN AND MANUFACTURING METHOD THEREOF, AND RESIST-PATTERN FORMING METHOD USING THE PHOTOMASK

BACKGROUND OF THE INVENTION

1. Field of the Invention

The present invention relates to a photomask for forming a resist pattern and fabrication method of the photomask and a resist-pattern forming method using the photomask.

2. Description of the Related Art

Lithography is used in the field of micro-fabrication, as well known. In the usual lithography, the planar form of a photomask pattern is once transferred onto resist. By etching process, the pattern on the resist is further transferred onto a layer-to-process, thus obtaining an etched pattern geometrical similar to the photomask pattern.

However, there is a recent proposal on an attempt to etch a layer-to-process three-dimensionally through use of lithography.

For example, in the optical-transmission system in which the signal light is propagated through an optical fiber from a semiconductor laser to a light-receiving diode, the emission light from the semiconductor laser is focused by a lens. By reducing the spot diameter of the emission light on an incident plane of the optical fiber nearly to a core diameter of the optical fiber, the transmission efficiency can be improved.

In such an application, a micro lens having a diameter of approximately 250 μm is used as exemplified in a conventional fabricating method, e.g. see Japanese Patent Applications Kokai No. H8-166666 (JP-A-H8-166666) and No. 2003-177507 (JP-A-2003-177507).

JP-A-H8-166666 discloses a fabrication method including the steps as follows. First, resist is applied onto a substrate that a lens is to form. On a transparent mask substrate, resist is exposed to light through use of a photomask formed with a shade film having concentric shade areas separated by spaces which are transparent areas. Then, the exposed resist is developed to obtain a resist pattern. Thereafter, the resist pattern is transferred by dry etch onto the substrate, thus obtaining a lens.

In the photomask used, the diametric pitch of the concentric shade areas is smaller than the length of a resolution limit exhibited by an optical system of an exposure equipment. Accordingly, the light transmitted through the photomask does not possess a sufficient contrast in terms of resolution for the resist. The dimension between adjacent spaces, i.e. spacing between shade areas, increases in a diametric direction of from the concentric center toward the outer. For this reason, the light intensity for exposing the resist is required greater toward the outer diametrically of the concentric circles. By developing the positive type resist through use of the photomask, a resist pattern is formed having a film thickness decreasing toward the diametric outer.

Meanwhile, JP-A-2003-177507 discloses, as a photomask, a method to form a phase grating with a plurality of grooves on a mask substrate so that the intensity of transmitting light can be changed stepwise depending upon the depth and width of the grooves.

However, in the photomask disclosed in JP-A-H8-166666, the shade areas are arranged concentrically. Due to this, where making a resist film equal in thickness in the positions equal in distant from the center as in the case to form a spherical lens, it can be achieved by concentrically arranging the shade film, i.e. patterning of the photomask. However, in other cases, it is impossible to apply a photomask arranged with shade areas concentrically.

A mask pattern arranged concentric has shade areas arranged in a planar form based on a curve line (hereinafter, referred to as a curve-line pattern).

It is a general practice to perform patterning along the straight lines that are in two directions orthogonal to each other and parallel with the surface of a mask substrate. For this reason, a curve-line pattern, or a pattern based on the other straight lines than in the two directions mutually orthogonal (hereinafter, referred to as an oblique pattern), is formed by a stepwise pattern formed in orthogonal two directions, i.e. in a form combining a multiplicity of rectangles. Thus, for curve-line or oblique patterns, there is a problem that the data required for producing a mask pattern increases in amount proportionally to the number of rectangles combined.

In the photomask disclosed in JP-A-2003-177507, there is a difficulty in precisely regulate the depth of the grooves constituting the phase grating. This raises a problem of a variation in the intensity of transmitting light and hence in resist pattern form.

In the photomask disclosed in JP-A-H8-166666, the resolution in the direction of thickness of the resist relies upon the maximal and minimal values and increment/decrement of the space widths. In the photomask disclosed in JP-A-2003-177507, the resolution relies upon the capability of regulating the depth of the grooves structuring the phase grating. The horizontal resolution relies upon the pitch in mask pattern, in the photomasks disclosed in JP-A-H8-166666 and JP-A-2003-177507. In order to improve the positional accuracy in the horizontal direction or the direction of thickness of the resist, there is a need to further reduce the space width minimal value in the photomask. However, this induces a great rise of photomask manufacturing cost. For this reason, there is a limitation in improving the resist-pattern positional accuracy by the mask pattern alone.

SUMMARY OF THE INVENTION

The present invention has been made in view of the foregoing problems.

It is an object of the present invention to provide a photomask and a method of fabricating same that, by using a mask pattern in a cellular form, a pattern can be determined for a desired form not necessarily equal in resist-film thickness in positions equal in distance from the center without increasing the amount of data required for producing the mask pattern.

Another object of the invention is to provide a resist-pattern forming method capable of improving the positional accuracy of a resist pattern by performing multiple-exposure through use of a mask pattern in a cellular form.

According to the present invention, there is provided a photomask for exposing a resist layer provided on an underlying layer to light transmitting through the photomask so that a resist pattern can be formed changing in film thickness on the overlying layer by performing development. The photomask includes a transparent mask substrate and a plurality of square mask cells. The square mask cells are set in rows and columns on a surface of the mask substrate by demarcating the surface by a plurality of straight lines orthogonal to each other at an equal interval. The square mask cells are respectively assigned with one of normalized light intensities, as an intensity of transmission light thereof, the normalized light intensities having three or more different values in which a maximum intensity of transmission light is taken 1. The mask cell has one side having a length provided smaller than a length of a resolution limit of an optical system of an exposure equipment for which the photomask is used.

The mask cell has any one or both of a light-transmission area and a shade area formed by a shade film provided over the mask substrate, to determine an intensity of the transmission light by an area ratio of the light-transmission area to the mask cell. Of the mask cells, the mask cells arranged successively in a column direction, if having the shade areas, provides the shade areas connected in order continuously in the column direction. Meanwhile, of the mask cells, the mask cells arranged successively in a row direction, if having the light-transmission areas and the shade areas, provides the shade areas non-connected in order in the row direction.

A method of fabricating a photomask of the present invention has the following process steps.

At first, after preparing a transparent mask substrate, a plurality of square mask cells are set in rows and columns on a surface of the mask substrate by demarcating the surface by a plurality of straight lines orthogonal to each other at an equal interval, each of which has one side having a length provided smaller than a length of a resolution limit of an optical system of an exposure equipment for which the photomask is used. Then, after setting the resist layer with film thickness in positions respectively corresponding to the mask cells, light intensities are assigned respectively transmitting through the mask cells as normalized light intensities, as intensities of transmission light thereof, corresponding to the film thickness and having three or more different values in which a maximum intensity of the transmission light is taken 1. Then, each of the mask cells in plurality is provided with any one or both of a light-transmission area and a shade area, to determine a light intensity by an area ratio of the light-transmission area to the mask cell. Then, a shade film is provided over the mask substrate, in the shade areas.

According to another aspect of the present invention, there is provided a method of fabricating a photomask for forming a resist pattern by exposing a resist layer provided on an underlying layer to light transmitting through the photomask so that a resist pattern can be formed changing in film thickness on the overlying layer by performing development, the method including: a step of providing, in a position where to use the photomask, a virtual mask plane having a coordinate origin in a position corresponding to an on-resist reference point set on the resist layer; a step of setting a plurality of square cells in rows and columns by demarcating the mask plane with a plurality of straight lines orthogonal to each other at an equal interval, each of which has one side having a length provided smaller than a length of a resolution limit of an optical system of an exposure equipment for which the photomask is used; a step of setting four subcells by drawing virtual divisional lines in row and column directions and dividing each of the cells into two equal parts with respect to the row and column directions; a step of setting film thickness of the resist layer for positions corresponding to each of the subcells; a step of setting one of normalized light intensities of light transmitting through the subcells as a subcell intensity, the subcell intensity corresponding to the film thickness, the normalized light intensities having three or more different values in which a maximum value of the light transmitting through the subcells is normalized to 1; a step of setting each of the subcells with a preparatory cell intensity having a set of four values and having an average value giving the subcell intensity; a step of providing first to fourth transparent mask substrates; a step of setting mask cells corresponding to the cells in rows and columns by demarcating with a plurality of straight lines orthogonal to each other at an equal interval, on a surface of each of the first to fourth mask substrates; a step of setting sub-mask-cells corresponding to the subcells by a plurality of virtual divisional lines drawn in row and column directions and setting an on-mask reference point, on the surface of each of the first to fourth mask substrates; a step of aligning the on-mask reference point of the first mask substrate with the coordinate origin; a step of aligning the on-mask reference point of the second mask substrate with a position shifted a distance of ½ times the one-side length of the mask cell in a row direction from the coordinate origin; a step of aligning the on-mask reference point of the third mask substrate with a position shifted a distance of ½ times the one-side length of the mask cell in a column direction from the coordinate origin; a step of aligning the on-mask reference point of the fourth mask substrate with a position shifted a distance of ½ times the one-side length of the cell in the row and column directions from the coordinate origin; a step of providing the sub-mask-cells of the first to fourth mask substrates with preparatory cell intensities corresponding to the subcells, in greater order; a step of selecting one of the preparatory cell intensities of the sub-mask-cells belonging to each of the mask cells of the first to fourth mask substrates; a step of setting any one or both of a light-transmission area and a shade area to each of the mask cells of the first to fourth mask substrates, and defining the cell intensity with a light intensity through each of the mask cells to a corresponding area of the resist layer; and a step of forming a shade film over the shade areas of each of the first to fourth mask substrates, thereby obtaining first to fourth photomasks.

According to further another aspect of the present invention, there is provided a method of fabricating a photomask for forming a resist pattern by exposing a resist layer provided on an underlying layer to light transmitting through the photomask so that a resist pattern can be formed changing in film thickness on the overlying layer by performing development, the method including: a step of providing, in a position where to use the photomask, a virtual mask plane having a coordinate origin in a position corresponding to an on-resist reference point set on the resist layer; a step of setting a plurality of square cells in rows and columns by demarcating the mask plane with a plurality of straight lines orthogonal to each other at an equal interval, each of which has one side having a length provided smaller than a length of a resolution limit of an optical system of an exposure equipment for which the photomask is used; a step of setting $n^2$ subcells by drawing virtual divisional lines in row and column directions and dividing each of the cells into n (n: integer of 2 or greater) equal parts with respect to the row and column directions;

a step of setting film thickness of the resist layer for positions corresponding to each of the subcells; a step of setting one of normalized light intensities of light transmitting through the subcells as a subcell intensity, the subcell intensity corresponding to the film thickness, the normalized light intensities having three or more different values in which a maximum value of the light transmitting through the subcells is normalized to 1; a step of setting each of the subcells with a preparatory cell intensity having a set of $n^2$ values and having an average value giving the subcell intensity; a step of providing first to $n^2$-th mask substrates; a step of setting mask cells corresponding to the cells by a plurality of virtual grid lines drawn in row and column directions mutually orthogonal, and setting sub-mask-cells corresponding to the subcells by a plurality of virtual divisional lines drawn in the row and column directions, and setting an on-mask reference point, on the surface of each of the first to $n^2$-th mask substrates; a step of setting the mask cells by shifting the column-directional position in increments/decrements of P/n from 0 to P/n×(n−1) (P: one-side length of the mask cell), shifting the row-directional position in increments/decrements of P/n from 0 to P/n×(n−1) relative to the column-directional position, with each position of which the on-mask reference point of each of the first to $n^2$-th mask substrates is aligned; a step of providing the sub-mask-cells of the first to $n^2$-th mask substrates with preparatory cell intensities corresponding to the subcells, in greater order; a step of selecting, as a cell intensity, one of the preparatory cell intensities of the sub-mask-cells belonging to each of the mask cells; a step of setting any one or both of a light-transmission area and a shade area to each of the mask cells, and defining the cell intensity with a light intensity to a corresponding area of the resist layer through each of the mask cells by means of an area ratio of the light-transmission area to the mask cell; and a step of forming a shade film over the shade areas of each of the first to $n^2$-th mask substrates, thereby obtaining first to $n^2$-th photomasks.

A method of forming a resist pattern of the present invention is to be performed by use of the foregoing mask, to form a resist pattern having a film thickness changing over an underlying layer.

Provided that an on-photomask position corresponding to an on-resist reference point set on the resist layer is taken 0 in both row and column directions, an on-mask reference point set on the photomask is shifted in position in increments/decrements of P×(1/n+m) (P: one-side length of the mask cell, n: integer of 2 or greater, and m: integer of 0 or 1 or greater) in the column direction from 0 to P×(1/n+m)×(n−1) and in increments/decrements of P×(1/n+m) in the row direction from 0 to P×(1/n+m)×(n−1) relative to each of the column-directional position, so that exposure is performed in each position.

In the photomask for forming a resist pattern of the present invention, the intensity of transmitting light can be set for each of the mask cells, in units of each of a plurality of mask cells arranged in rows and columns horizontally. Accordingly, a photomask can be easily obtained for a desired form of pattern, particularly for a desired form not equal in resist-film thickness in positions equal in distance from the center.

According to the method of forming a resist pattern of the present invention, $n^2$ times or multiple-exposure is performed while horizontally shifting the photomask relative to the resist. As a result, exposure is possible at a halftone in units of a magnitude the intensity of once exposure is divided by $n^2$. By performing exposure while horizontally shifting the photomask (1/n+m) times the length of the mask cell relative to the resist, the horizontal positional resolution can be taken one-n-th (1/n) the mask cell size.

BRIEF DESCRIPTION OF THE DRAWINGS

FIGS. 18A-18I are schematic views for explaining the correction of the mask for intensity of light;

DETAILED DESCRIPTION OF THE INVENTION

With reference to the drawings, description will be now made on embodiments of the present invention, wherein constituent elements are schematically shown as to arrangement relationship in a degree to understand the invention. Although preferred embodiments of the invention will be described from now on, the materials and numerical conditions of the elements are mere suitable examples. Therefore, the invention is never limited to the embodiments given in the following. Note that, in the ensuing figures, hatching is partly applied to plan views in order to place emphasis on the required regions thereof, which hatching or the like is not to represent a sectional plane at all.

Photomask

Figure 1A:
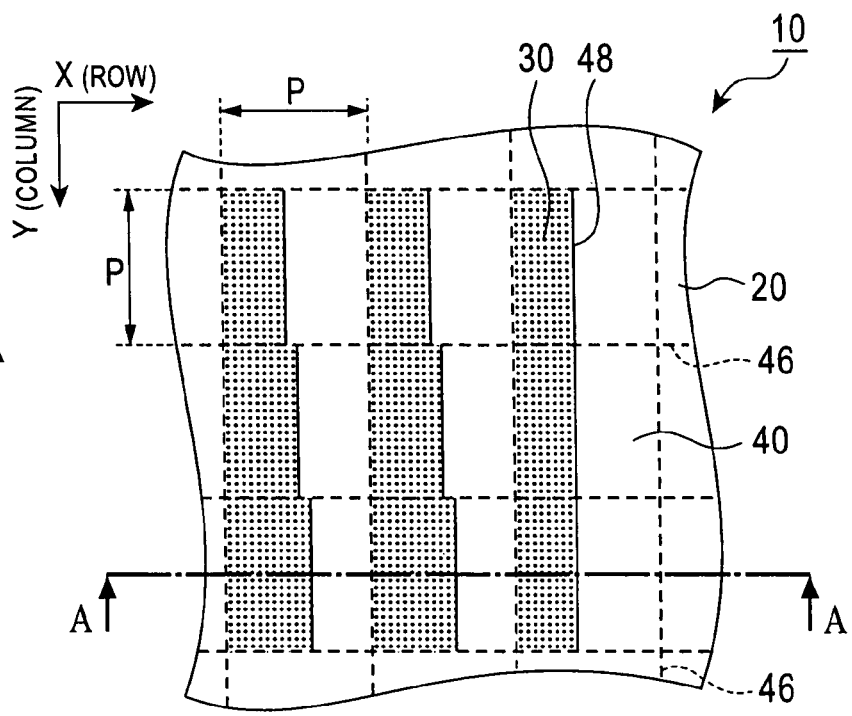
FIGS. 1A-1C are schematic views illustrating a photomask.
Figure 1B:
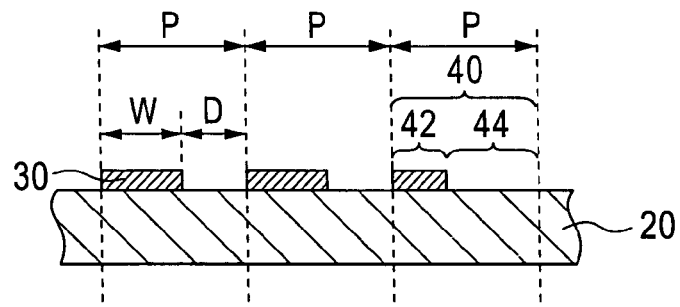
Figure 1C:
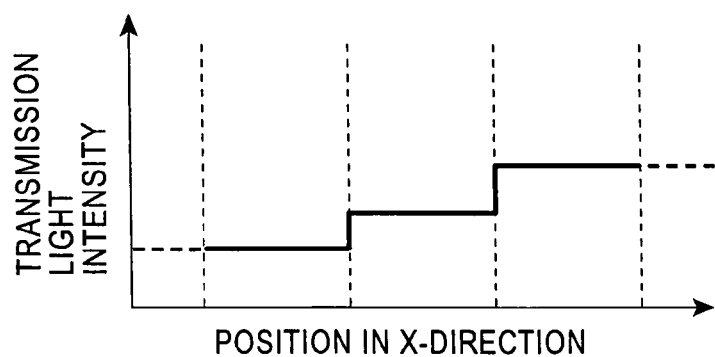

Referring to FIGS. 1A-1C, description is now made on a photomask for forming a resist pattern. FIGS. 1A-1C are schematic views illustrating a photomask. FIG. 1A is a plan view of a photomask in a part thereof as viewed from above.

FIG. 1B is a view showing a section taken along line A-A in FIG. 1A. FIG. 1C is a view for explaining a relationship between a position in a direction (X direction) along the line A-A in FIG. 1A and an intensity of transmitting light. In FIG. 1C, an X-directional position is taken on the axis of abscissa while a light intensity is on the axis of ordinate.

A photomask 10 has a plurality of square mask cells 40 equal in size, on a transparent mask substrate 20 such as of quartz glass. The mask cells 40 are provided in a plurality of unit mask-cell areas defined on one main surface of the mask substrate 20. The unit mask-cell areas are defined by demarcating the one main surface of the mask substrate 20 by means of a plurality of virtual grid lines 46 drawn straight at an equal interval in X (or row) and Y (column) directions orthogonal to each other. Accordingly, the unit mask-cell areas are arranged in an orthogonal matrix form (in rows and columns).

The mask cell 40 is set as any one or both of a light-transmission area 44 and a shade area 42. In the shade areas 42 on the mask substrate 20, a shade film 30 is formed by evaporating chromium, for example. The mask cell 40 is a basic unit to regulate the intensity of light transmitting through the photomask 10. For the mask cell 40 with an equal area, the light transmitting through the mask cell 40 is given an intensity as determined depending upon the ratio in area of the light-transmission area 44 to the mask cell 40. Namely, the light transmitting through the mask cell 40 has an increased intensity as the light-transmission area 44 has an increased area in the mask cell 40 (FIG. 1C).

Here, where, of the plurality of mask cells, the mask cells arranged successively in the column direction have shade areas, those shade areas are provided connected in order and continuous in the column direction. Where, of the plurality of mask cells, the mask cells arranged successively in the row direction have light-transmission and shade areas, the shade areas are provided non-connected in order in the row direction.

Incidentally, FIG. 1A shows an example that the mask cell 40, in which both light-transmission and shade areas 44, 42 are set, is divided into two parts by a Y-directional virtual divisional line 48, wherein the light-transmission area 44 is arranged on one side of the virtual divisional line 48 (in the right of the virtual divisional line, in the figure) while the shade area 42 is on the other side thereof (in the left of the virtual divisional line, in the figure). For the mask cells, the light-transmission areas 44 are preferably arranged on the same side with respect to the virtual divisional line 48. This is because of the following reason.

When a target resist form has a curved surface whose film thickness changes continuously, the mask cells 40 equal in light intensity are possibly arranged continuous in a region the resist film has a thickness changing moderately. In case the mask cells 40 are arranged having light-transmission areas 44 on the same side with respect to the virtual divisional line 48, the shade areas are structured as one rectangle for the mask cells 40 that are equal in light intensity and arranged successively in the Y-direction. The amount of data required for forming a mask pattern increases and decreases depending upon the number of rectangles structuring the mask pattern. Accordingly, by forming the shade film 30 over the mask cells 40 collectively in one rectangle, it is impossible to reduce the amount of data required in forming the mask pattern. This results in reduction of the time required in fabricating a photomask and hence the cost thereof.

FIGS. 1A and 1B show the example that light-transmission and shade areas 44, 42 are provided on every mask cell 40. However, this example is not limitative. Namely, the photomask may have mask cells arranged only with light-transmission areas 44 without providing shade areas or mask cells arranged only with shade areas 42 in the mask cells 40 without providing light-transmission areas.

The mask cell 40 has one side having a length (hereinafter, may be referred to as a mask pitch) P provided smaller than the length of a resolution limit of an optical system of an exposure equipment using the photomask 10. For this reason, when the resist is exposed to light by use of the photomask 10, it is impossible to obtain a contrast for resolving the mask pattern of the photomask. When the resist is developed after exposed to light through use of the photomask 10, the resist has a film thickness changing continuously without being separated.

When using an i-line stepper, for example, having a wavelength λ of 365 nm and a reduction-projection magnification of ×5 (five times) as an exposure equipment, the lithographic optical system has a resolution characteristic depending upon the numerical aperture NA of the projection lens and the coherence factor σ. Table 1 shows a dependence of an optical contrast M upon a pitch, a numerical aperture NA and a coherent factor σ. Here, the ratio of the width D of the light-transmission area (space) 44 and the width W of the shade area (line) 42 is taken as 1:1. The pitch corresponding to a length the mask pitch P is projected onto a resist surface. For a reduction-projection magnification is ×5, the pitch is one-fifth of the mask pitch P.

The optical contrast M is expressed as M=(lmax−lmin)/(lmax+lmin). The light transmitting through the photomask has an intensity changing sinusoidal, within one period of which the intensity has a maximum value of lmax and a minimum value of lmin.

TABLE 1

| Pitch | NA | | | | | | | | |
| --- | --- | --- | --- | --- | --- | --- | --- | --- | --- |
| | 0.50 | | | 0.55 | | | 0.60 | | |
| (nm)σ | 0.3 | 0.5 | 0.7 | 0.3 | 0.5 | 0.7 | 0.3 | 0.5 | 0.7 |
| 400 | 0 | 0 | 0 | 0 | 0 | 0.02 | 0 | 0 | 0.15 |
| 500 | 0 | 0.03 | 0.22 | 0 | 0.25 | 0.40 | 0.20 | 0.46 | 0.55 |
| 600 | 0.19 | 0.46 | 0.55 | 0.57 | 0.67 | 0.69 | 0.87 | 0.84 | 0.81 |

Generally, the lithographic optical system has a resolution proportional to λ/NA. Accordingly, as wavelength is shorter or numerical aperture NA is greater, there is a decrease in the pitch at which optical contrast M becomes 0 (zero), i.e. the pitch at which not obtainable is an optical contrast for resolving the pattern of a photomask. For example, where numerical aperture NA is 0.5 and coherent factor σ is 0.5, an optical contrast M of the transmission light intensity projected onto the wafer becomes 0 at a pitch of 480 nm on the resist (hereinafter, referred to as on-resist pitch) (i.e., at a mask pitch P of 2.4 μm) or smaller. However, the optical contrast M is not limited to 0 but, even when optical contrast M slightly occurs, it may be within a range the effect of the optical contrast M upon the resist is allowable. For example, where numerical aperture NA is 0.5 and coherent factor σ is 0.5, the optical contrast M is 0.03 at a pitch of 500 nm. In this case, the effect of the optical contrast M upon the resist is allowable.

As described above, the mask pitch P has an upper limit to be determined depending upon the magnitude the optical contrast M is rendered 0 by the lithographic optical system. The shorter the mask pitch P becomes, the higher the horizontal resolution becomes. However, there is a technical difficulty in decreasing the width D of the light-transmission area 44 or the width W of the shade area 42 that can be fabricated as a photomask. For this reason, if the one-side length of the mask cell 40 is decreased with fixing minimal values of the width D of the light-transmission area 44 and the width W of the shade area 42, then the variable range of light intensity decreases.

It is assumed that the on-resist minimal dimension available in mask fabrication is 150 nm at an on-resist pitch of 480 nm. Note that, in the following, dimensions used are in terms of on-resist values unless otherwise noted. The dimension on the photomask is obtained by a multiplication of reduction-projection magnification on on-resist dimension, i.e. five times in the present example. In this case, the space width, i.e. the light-transmission area width can be set at 150-330 nm in terms of on-resist dimension. At a pitch of 400 nm, the minimal dimension available is assumed 150 nm in mask fabrication. In this case, the space width available is 150-250 nm. In the case the space width is adjusted in increments/decrements of 1 nm, the number of intensity levels of light is 181 at a pitch of 480 nm and 101 at a pitch of 400 nm. When the pitch is small, the number of intensity levels of light, i.e. light intensity, lowers in resolution. The opening area ratio of the cell is 31-69% at a pitch of 480 nm and 38-63% at a pitch of 400 nm. Namely, a variable range of the light intensity is narrower when the pitch is smaller.

By using a precise mask fabrication technique, i.e. by reducing the minimal dimension in mask fabrication, the on-resist pitch can be reduced with the equivalent number of intensity levels. For example, if assuming the pitch is 300 nm and the on-resist minimal dimension is 70 nm, the space width available is 70-230 nm, thus obtaining the number of intensity levels of 161 when regulated in increments/decrements of 1 nm. However, reducing the minimal dimension raises a mask-cost increase. Therefore, there is a need to select the optimal condition for the on-resist pitch in consideration of a pattern to form, a lithographic optical system, a minimal dimension in mask fabrication and mask cost. When the resist to apply is sufficiently as great as several tens to several hundreds micrometers, the on-resist pitch is suitably 400-500 nm.

According to the photomask for forming a resist pattern, the intensity of light to pass through can be set for each of the mask cells. Therefore, it is easy to obtain a photomask needed for a desired pattern, particularly for a desired form having a resist-film thickness not equal at points equally distant from the center thereof.

Resist-Pattern Forming Method Using a Photomask

Description is now made on an example to form a lens having a diameter of 250 µm, a radius of curvature of 1162 µm and a sag of 3.3 µm. Here, the sag represents a height of a curve line as measured from the chord. An i-line stepper was used as an exposure equipment, to provide an exposure condition of NA=0.5, σ=0.5 and a reduction-projection magnification of ×5 (five times). A positive type of resist was used (hereinafter, referred to as positive resist-1). A mask-cell size, i.e. patterning pitch, is 400 nm while mask minimal dimension is 120 nm.

Figure 2A:
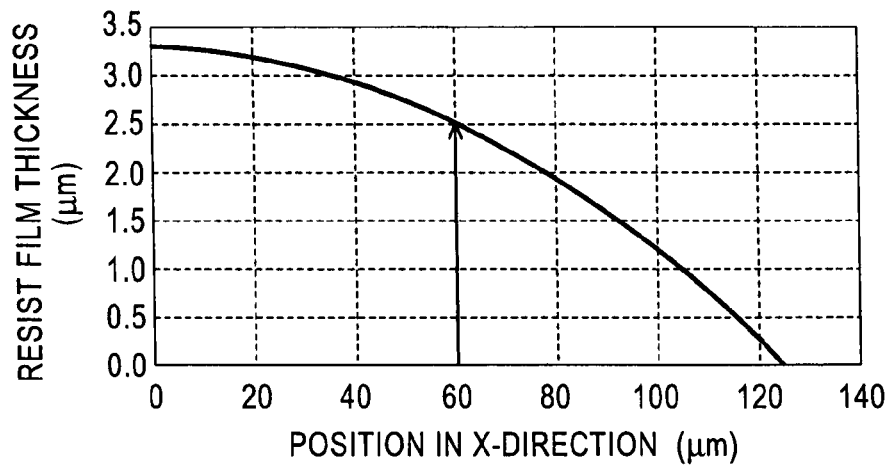
FIGS. 2A-2C are views illustrating a procedure of arranging a mask pattern.
Figure 2B:
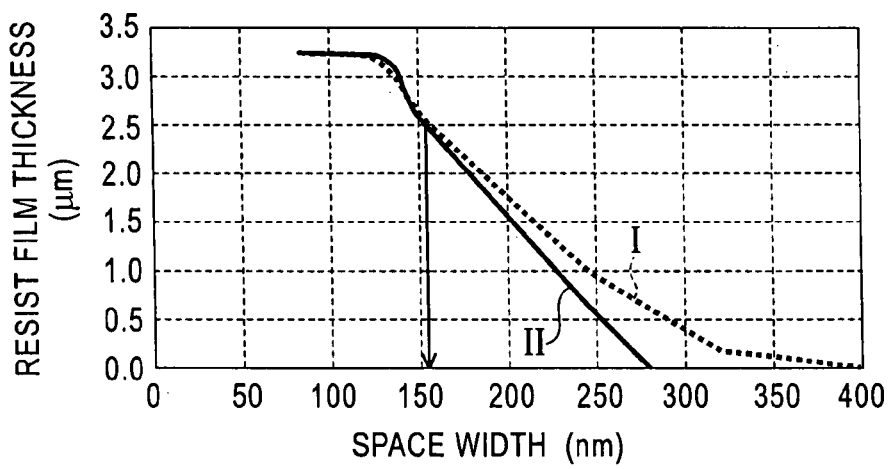
Figure 2C:
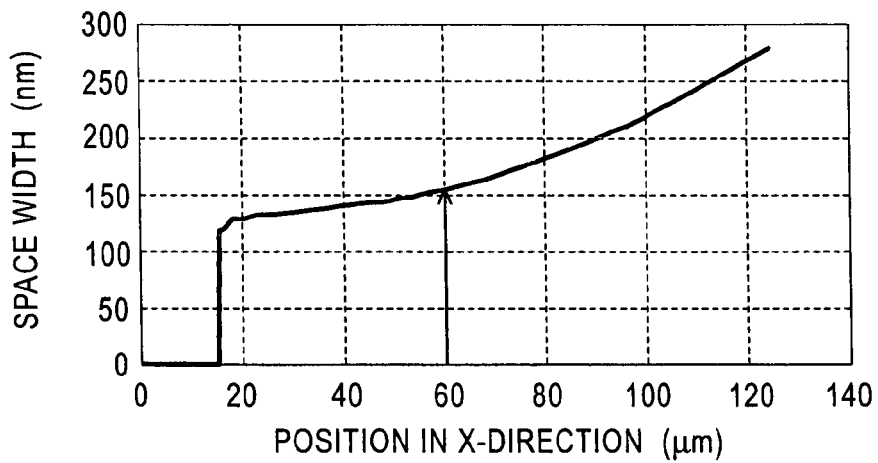

Referring to FIGS. 2A-2C, description is now made on a procedure to arrange a pattern for a photomask. FIGS. 2A-2C are views illustrating the procedure to arrange a mask pattern. FIG. 2A is a view showing a target resist form, FIG. 2B is a view showing a film thickness of the resist exposed and developed against a space width therein, FIG. 2C is a view showing a space width against a position. It is assumed that the resist is circular in form on the XY plane wherein X and Y coordinates of a lens center are taken as (X=0, Y=0).

FIG. 2A shows a range of X=0-125 µm at Y=0. In FIG. 2A, an X-directional position (unit: µm) is taken on the axis of abscissa while a resist-film thickness (unit: µm) is on the axis of ordinate. The target thickness of resist is from 0 to 3.3 µm correspondingly to the form of a lens to fabricate.

In order to determine a mask pattern arrangement, there is a need of a relationship between a space width and a remaining-resist-film thickness. FIG. 2B shows a resist-film thickness against a space width (see FIG. 1B), wherein there is shown a resist-film thickness after a lapse of exposure time of 900 milliseconds where used photomasks respectively having test patterns A and B different from each other. In FIG. 2B, a space width (unit: nm) is taken on the axis of abscissa while a remaining-resist-film thickness (unit: µm) is on the axis of ordinate. In FIG. 2B, a curve line I shows a result when the photomask having test pattern A is used while a curve line II a result when the photomask having test pattern B is used.

Figure 22:
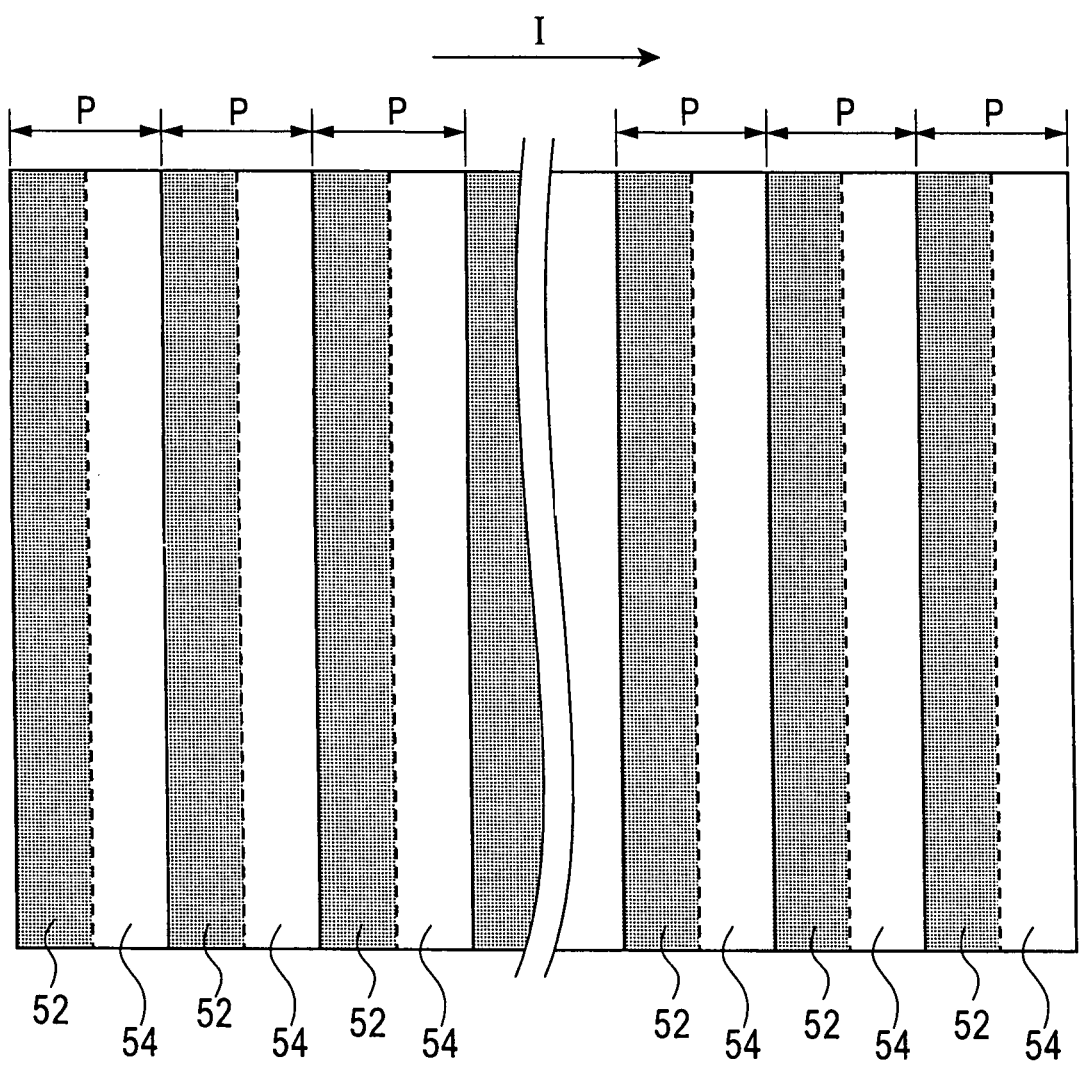
FIG. 22 is a typical view showing a form of test pattern A.

FIG. 22 is a typical view illustrating the form of test pattern A. In a test pattern A, shade areas 52 are formed in a stripe form at a constant mask pitch P and with a constant width of a light-transmission area 54, over a rectangular mask substrate whose one side is 2300 µm. Here, test pattern A uses a plurality of patterns that are different in the width of the light-transmission area 54. For example, provided that the on-resist mask pitch P has a dimension of 400 nm, the light-transmission areas 54 are provided widths in increments/decrements of 10 nm from 80 nm to 320 nm. Besides, prepared as test pattern A are those having a width of the light-transmission area 54 of 0 nm, i.e. not formed with light-transmission areas 54 and those having a width of the light-transmission area 54 of 400 nm, i.e. not formed with shade areas 52. In FIG. 2B, the curve line I shows a result in the case of using a plurality of test patterns A different from each other in the width of light-transmission area 54.

A test pattern B is a pattern whose exposure region in its size and form is assumed for a lens having a target diameter of 250 µm, e.g. the exposure region is made in its size or form as a circular form having a diameter of 250 µm. When performing exposure to light by using test patterns A and B, there is exhibited a tendency that the remaining-resist-film thickness is smaller for the equal space width when using test pattern B (curve line II) as compared to that when using test pattern A (curve line I). It can be understood that the tendency is more remarkable as the space width is greater, i.e. as the resist layer to be developed is greater in thickness. This can be considered because of the reason that, when using test pattern A, dissolved products take place in a greater amount as the space width becomes greater, i.e. as nearing a region the resist is dissolved deeper, in which region the resist lowers in its development rate. Accordingly, in order to exclude the effect of the dissolved products caused upon development, it is preferable to use a relationship between a space width and a resist-film thickness in test pattern B which is nearer to the target form to a possible extent.

According to the curve line II in FIG. 2B, a resist-film thickness of 3.3 µm is obtained at a space width of 120 nm, i.e. the minimal space width, with an exposure time of 900 milliseconds, while a resist-film thickness of 0 µm is obtained at a space width of 280 nm, i.e. the maximal space width, with the same exposure condition. As a result, it can be understood that, by regulating the space width in increments/decrements of 1 nm, a resist-film thickness of 0-3.3 µm can be set with intensity levels of 160.

Then, the objective pattern shown in FIG. 2A is divided into resist cells having one side of 400 nm, to determine a resist-film thickness at each resist cell center. For example, the resist-film thickness is given 2.5 µm at an X-directional position of 60 µm. Then, using FIG. 2B, a space width is determined that provides a resist-film thickness of 2.5 µm. With test pattern B, at a resist-film thickness of 2.5 µm, the corresponding space width is determined from the curve line II to be 156 nm in the mask cell.

By determining a space width in respect of Y=0 and X=0-125 µm, i.e. as to the lens radius, a space width distribution is obtained against a position, as shown in FIG. 2C. FIG. 2C shows a space width distribution wherein an X-directional position (unit: µm) is taken on the axis of abscissa while a space width (unit: nm) is on the axis of ordinate.

By performing the above operation as to X=−125 to 125 µm and Y=−125 to 125 µm, data can be obtained over the entire space width. Then, by using a well-known suitable mask-fabrication apparatus, light-transmission and shade areas providing a predetermined space width are set in the corresponding unit mask-cell areas of a mask substrate. Thereafter, a shade film is formed over the shade areas, thus obtaining a photomask.

Description is now made on a method of forming a resist pattern by use of the photomask.

At first, positive resist-1 is applied over a silicon (Si) substrate-to-process, to obtain a resist layer having a film thickness of 3.3 µm. Then, pre-bake is performed at an atmospheric temperature of 90° C. for 100 seconds.

Then, exposure to light is performed for 900 milliseconds by use of an i-line stepper. Thereafter, post-exposure bake is performed at an atmospheric temperature of 110° C. for 100 seconds.

After performing a development with using an alkali developer for 90 seconds, post-development bake is performed at an atmospheric temperature of 120° C. for 100 seconds, thereby obtaining a resist pattern.

Figure 3A:
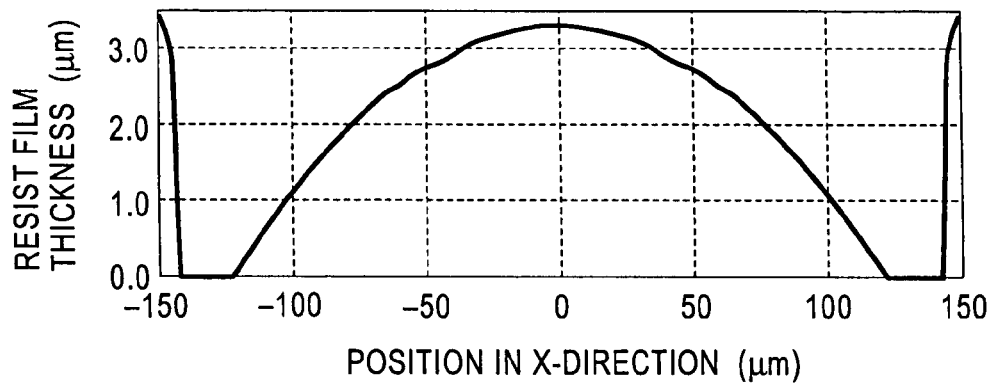
FIGS. 3A and 3B are views illustrating a resist pattern where positive resist-1 is used.
Figure 3B:
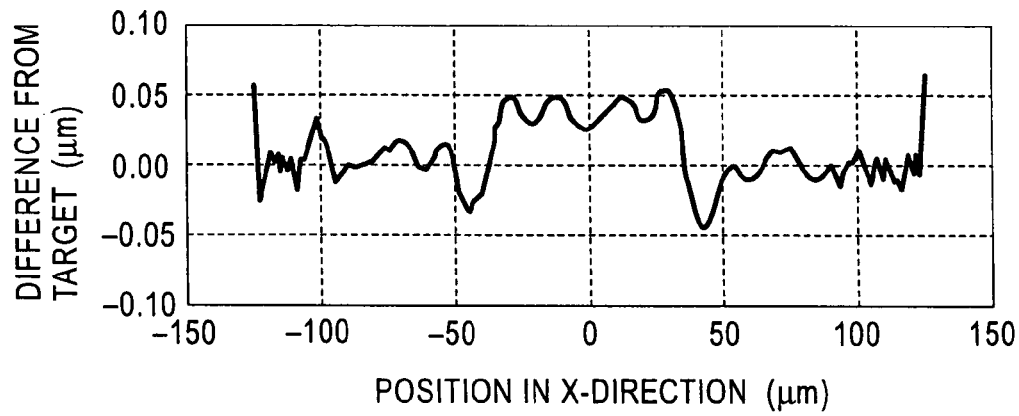

Referring to FIGS. 3A and 3B, description is now made on a resist pattern when using a positive resist-1. FIGS. 3A and 3B are views illustrating a resist pattern form when the positive resist-1 is used. FIG. 3A shows a form of a resist pattern obtained wherein an X-directional position (unit: µm) is taken on the axis of abscissa while a resist-film thickness (unit: µm) is on the axis of ordinate. FIG. 3B shows a difference in form between an obtained resist pattern and a target resist pattern wherein an X-directional position (unit: µm) is taken on the axis of abscissa while a difference between a resist-film thickness obtained and a target resist thickness (unit: µm) is on the axis of ordinate.

When using the positive resist-1, a spherical pattern of resist is obtained in which the resist-film thickness changes continuously, as shown in FIG. 3A. As shown in FIG. 3B, a positional accuracy of approximately ±50 nm is obtained in the film-thickness direction relative to the target pattern form of resist.

When using the positive resist-1, a positional accuracy of approximately ±50 nm is obtained relative to the target pattern form of resist. However, concavo-convex was remarkable of the resist surface. By the study made to eliminate such concavo-convex form, it has been found that improvement is possible by adjusting the dissolving characteristic of resist.

Figure 4:
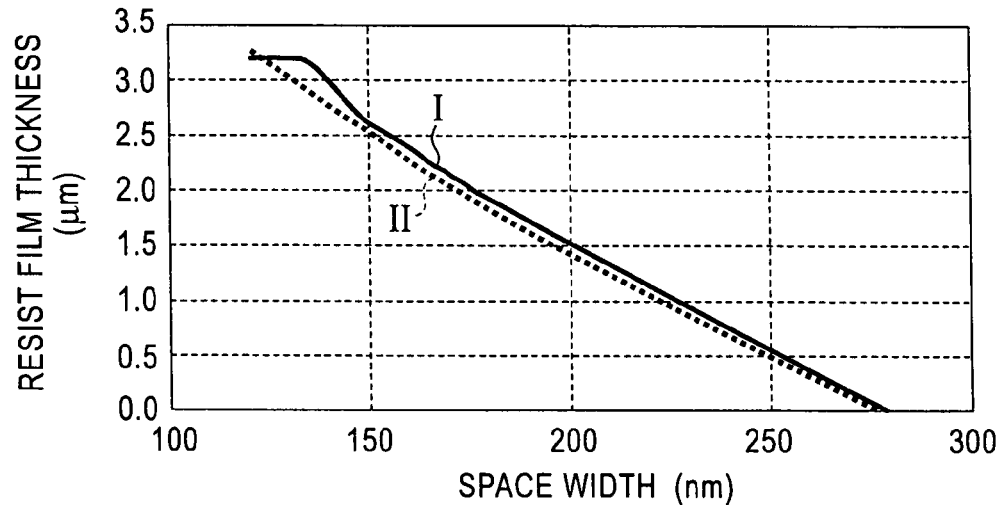
FIG. 4 shows a characteristic for explaining a relationship between a space width of mask pattern and a remaining-resist-film thickness.

FIG. 4 shows a characteristic for explaining a relationship between a space width of a positive resist and a film thickness of the remaining resist. In FIG. 4, a space width (unit: µm) is taken on the axis of abscissa while a film thickness of the remaining resist (unit: µm) is on the axis of ordinate. In FIG. 4, the curve line I shows a characteristic of the positive resist-1 while the curve line II shows a characteristic of a different one of positive resist (hereinafter, referred to as positive resist-2) from the positive resist-1.

With the positive resist-1 (curve line 1), dissolving behavior is sharp in a region of a resist surface (around a resist-film thickness of approximately 3.3 µm). This can be considered because a surface-indissoluble layer is formed thick. With the positive resist-2 (curve line II), dissolving behavior is smooth in a resist-surface region as compared to the positive resist-1.

Figure 5:
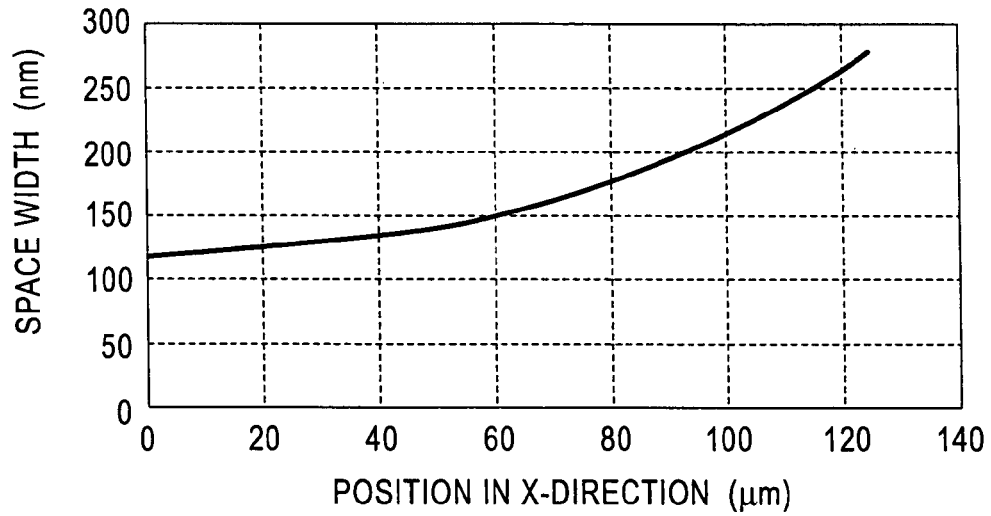
FIG. 5 is a view showing a mask-pattern arrangement when the positive resist-2 is used.

FIG. 5 is a view showing a mask-pattern arrangement when the positive resist-2 is used, wherein an X-directional position is taken on the axis of abscissa while a space width (unit: µm) is on the axis of ordinate. By performing the above operation in respect of X=−125 µm-125 µm and Y=−125 µm-125 µm, mask-pattern data is obtained over the entire region. Thereafter, by using a well-known suitable mask-fabrication apparatus, a photomask is formed based on the mask pattern data.

Then, after applying the positive resist-2 over the silicon (Si) substrate-to-process, pre-bake is performed at an atmospheric temperature of 90° C. for 60 seconds.

Then, exposure is performed for 280 milliseconds by use of an i-line stepper. Thereafter, post-exposure bake is performed at an atmospheric temperature of 110° C. for 100 seconds.

After performing a development with using an alkali developer for 90 seconds, post-development bake is performed at an atmospheric temperature of 120° C. for 100 seconds, thereby obtaining a resist pattern.

Figure 6A:
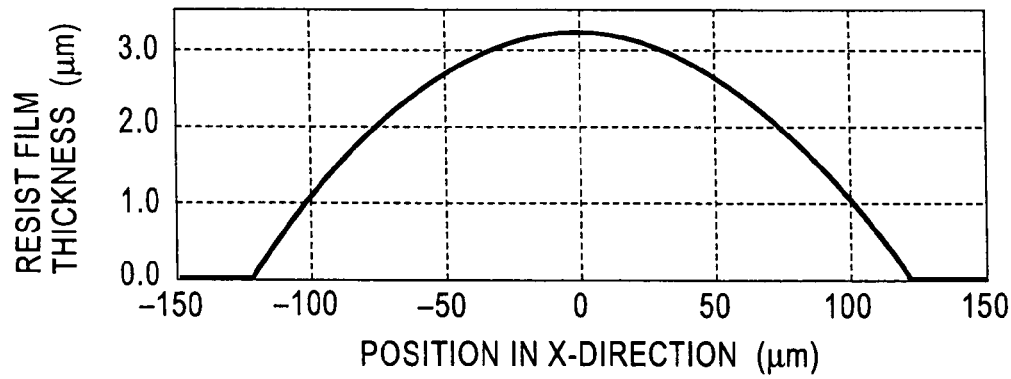
FIGS. 6A and 6B are views for explaining a resist pattern form when the positive resist-2 is used.
Figure 6B:
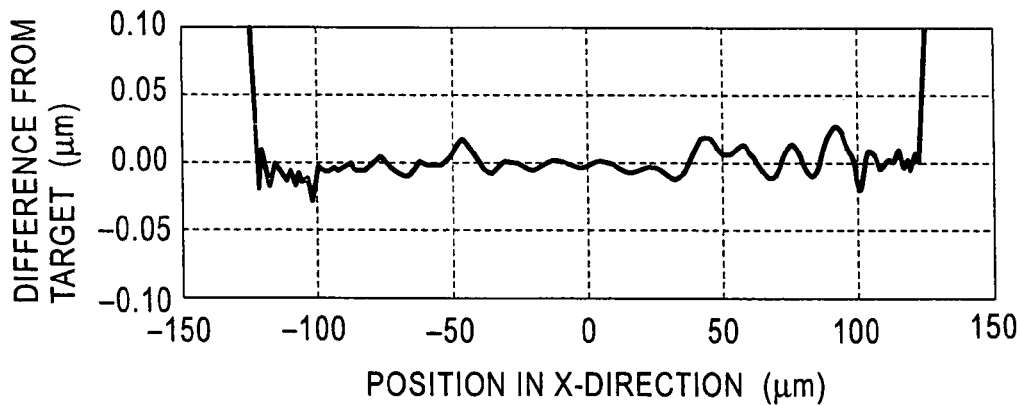

Referring to FIGS. 6A and 6B, description is now made on a form of a resist pattern obtained by the present method. FIGS. 6A and 6B are views for explaining a resist pattern form when the positive resist-2 is used. FIG. 6A shows a form of a resist pattern obtained wherein an X-directional position (unit: µm) is taken on the axis of abscissa while a resist-film thickness (unit: µm) is on the axis of ordinate. FIG. 6B shows a difference in form between an obtained resist pattern and a target resist pattern wherein an X-directional position (unit: µm) is taken on the axis of abscissa while a difference between an obtained resist-film thickness and a target resist thickness (unit: µm) is on the axis of ordinate.

As shown in FIG. 6A, a spherical pattern of resist is obtained in which the resist-film thickness changes continuously. As shown in FIG. 6B, by using the positive resist-2, a positional accuracy of approximately ±25 nm is obtained in the film-thickness direction relative to the target pattern form of resist.

In this manner, in order to obtain a resist-pattern form approximate to the target form, it is preferable to use a resist not having a sharp dissolving characteristic due to a surface-indissoluble layer as was remarkable in the positive resist-1 but having a dissolving behavior smooth over the entire as in the positive resist-2.

Resist Pattern Forming Method with Multiple-Exposure

Figure 7:
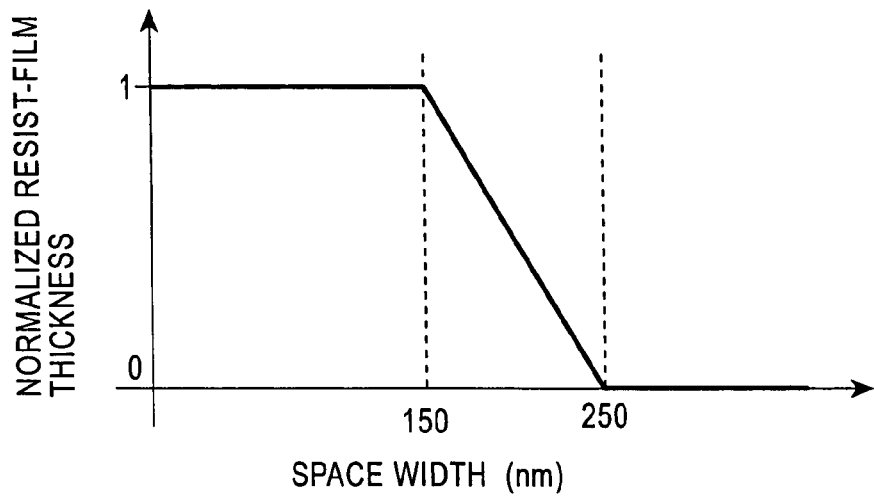
FIG. 7 is a view showing a dependence of a resist-film thickness upon a space width.

In the following description, the pitch on the resist is assumed as 400 nm and the on-resist dimension of the minimal mask dimension is as 150 nm. The resist layer is assumed having a film thickness of 3.5 µm. As shown in FIG. 7, the resist is considered as a positive one having a linear dissolving characteristic in a space width range of 150-250 nm. In FIG. 7, a space width (unit: µm) is taken on the axis of abscissa while a resist-film thickness normalized by taking the film thickness of the remaining maximal resist film as 1, i.e. resist-film thickness when the shade area has a width equal to the mask minimal dimension, is on the axis of ordinate.

Provided that a minimal increment/decrement for the space width is 10 nm, the normalized resist-film thickness can be regulated from 0 to 1 in 11 levels in increments/decrements of 0.1.

Figure 8A:
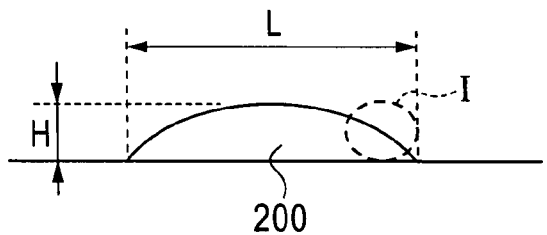
FIGS. 8A and 8B are views for explaining a lens form and a contour map of resist form, respectively.
Figure 8B:
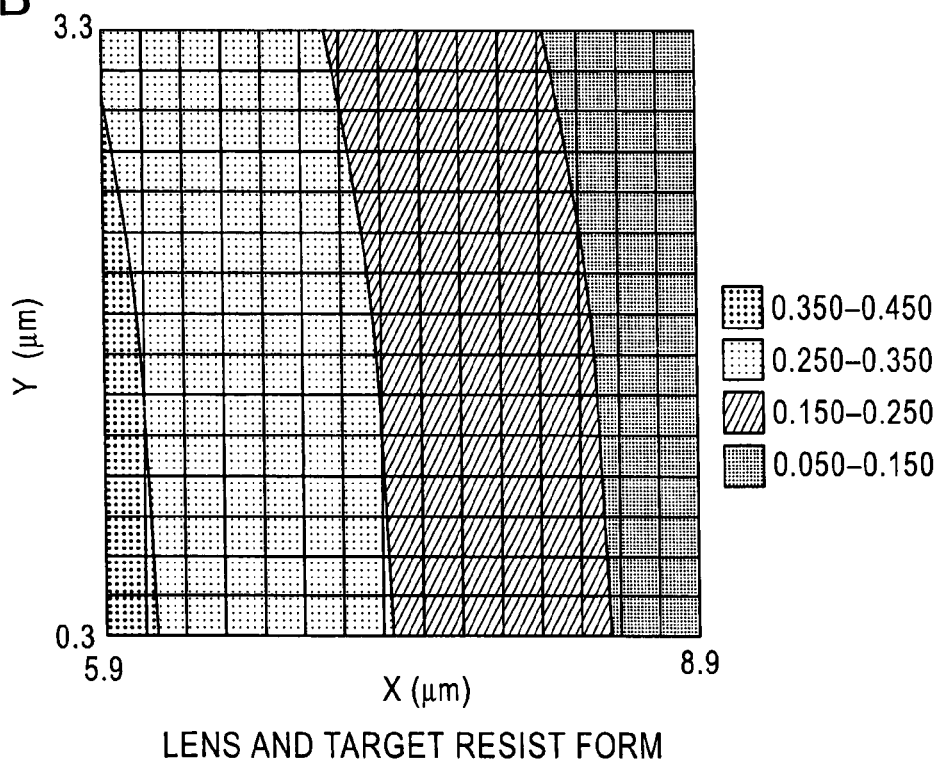

Referring to FIGS. 8A and 8B, description is now made on the form of a plano-convex lens and target resist form. FIG. 8A is a side view illustrating a lens form, whose flat surface is placed on an XY plane while the convex surface is arranged along the Z-axis. A lens 200 is assumed to be a part of a spherical surface, which has a diameter L of 20 µm, a radius of curvature of 101 µm and a sag H of 2 µm. FIG. 8B is a contour map of a target resist form when taking the center of the lens 200 as the origin of an XY plane. FIG. 8B shows a lens outer peripheral region having a greater change rate by extracting a region of X=5.9-8.9 and Y=0.3-3.3, which region is shown at I in FIG. 8A. Here, the resist-film thickness can be expressed by using a normalized resist-film thickness in which the resist-film thickness is normalized as the maximum value is 1. Note that the resist-film thickness in the following uses the normalized value unless otherwise noted.

The resist-film thickness can be regulated in 11 levels in increments/decrements of 0.1 from 0 to 1. Accordingly, for a resist cell having a target resist-film thickness of 0.05 to 0.15, the resist film is set with a thickness of 0.1. For a resist cell of 0.15 to 0.25, the resist film is set with a thickness of 0.2. In a similar manner, the resist film is set for each of the values for the subsequent resist cells.

Over the resist, a plurality of virtual grid lines are drawn at an equal interval in the X and Y directions. By the virtual grid lines, square resist cells each having one side length of 0.4 µm are set adjacently in rows and columns on the resist (FIG. 8B).

The light intensity, required to obtain a resist thickness at the center of the resist cell, is set as a cell intensity. By normalizing the light intensity in a manner providing the maximum value as 1, the normalized light intensity has one-to-one correspondence with the normalized resist-film thickness. Accordingly, in the following description, the terms "resist-film thickness" and "light intensity" are to be used in the same sense. Here, where a positive resist is used, when the light intensity is maximum, i.e. when the normalized intensity is 1, the remaining resist-film thickness is minimum, i.e. the normalized film thickness is 0. When the light intensity is minimum, i.e. when the normalized intensity is 0, the remaining resist-film thickness is maximum, i.e. the normalized film thickness is 1. Where a negative resist is used, when the light intensity is maximum, i.e. when the normalized intensity is 1, the remaining resist-film thickness is maximum, i.e. the normalized film thickness is 1. When the light intensity is minimum, i.e. when the normalized intensity is 0, the remaining resist-film thickness is minimum, i.e. the normalized film thickness is 0.

Preparing a mask substrate, a plurality of square mask cells are set by demarcating the surface of the mask substrate at an equal interval by means of a plurality of straight lines orthogonal to each other. Because the resist cell has a one-side length of 0.4 µm, the mask pitch P is 2 µm at a reduction-projection magnification of ×5 (five times). The mask cells each have a one-side length of 2 µm and correspond to the resist cells in a one-to-one relationship.

Then, any one or both of light-transmission and shade areas are set in each of the mask cells. By the area ratio of the light-transmission area to the mask cell (opening-area ratio), the intensity of the light transmitting the mask cell and illuminated to the corresponding resist area is defined as a cell intensity. The cell intensity of the mask cell is given as a normalized light intensity corresponding, one-to-one, to a normalized film thickness of the resist cell corresponding to the mask cell. Thereafter, a shade film is formed over shade areas of the mask substrate, to obtain a photomask explained with reference to FIGS. 1A and 1B.

Description is now made as to forming a resist pattern with through use of the photomask, with comparing between the case of the usual once exposure and the case of multiple-exposure of the invention.

Firstly, description is now made for the once exposure method.

By taking the position on a photomask plane, corresponding to a on-resist reference point (origin on a resist plane) set on the resist, as an optical reference point, the on-mask reference point set on the photomask (origin on the mask plane) is aligned with the optical reference point to perform an exposure to light.

Figure 9:
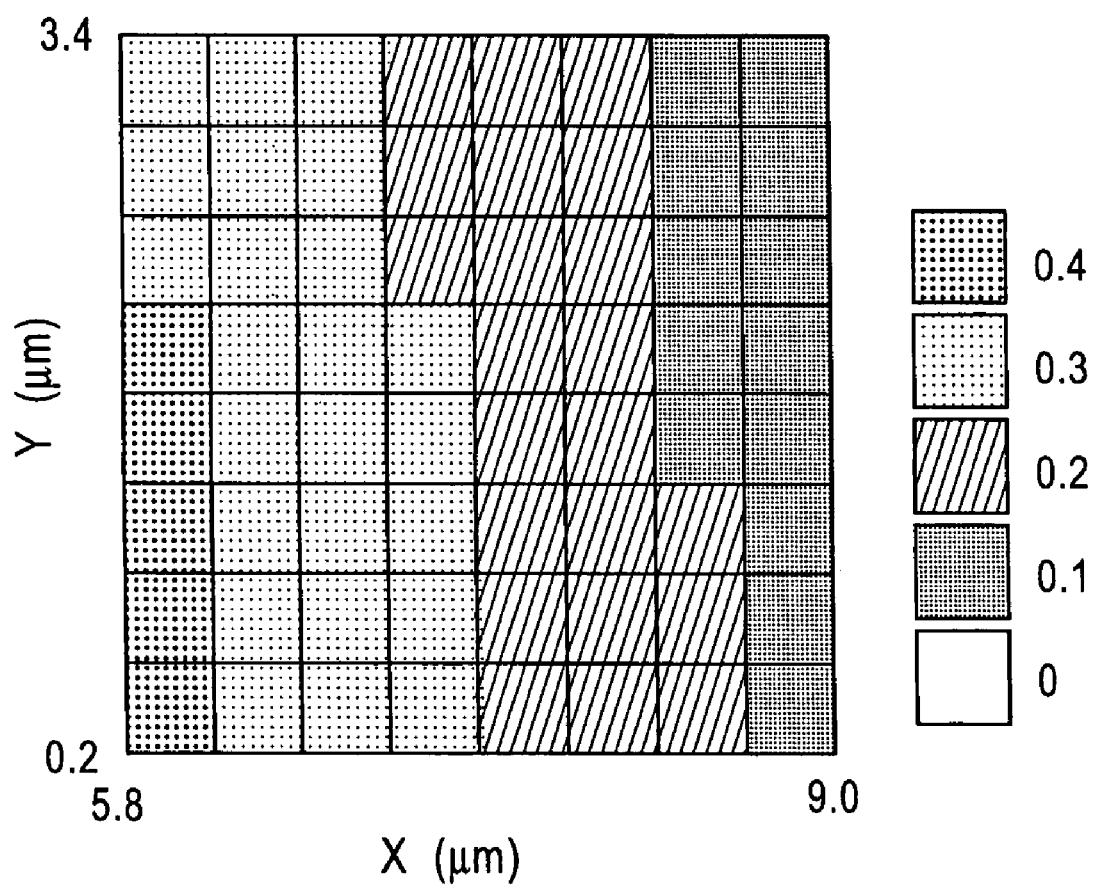
FIG. 9 is a contour map showing a resist-film thickness in once exposure.

FIG. 9 is a contour map showing a resist-film thickness obtained by exposure and development with using the photomask. In FIG. 9, 0.4-µm resist cells are allocated to the FIG. 8A region I, wherein illustrated is a region given by X=5.8-9.0 and Y=0.2-3.4. In each resist cell, the resist-film thickness is provided as a normalized film thickness.

Figure 10A:
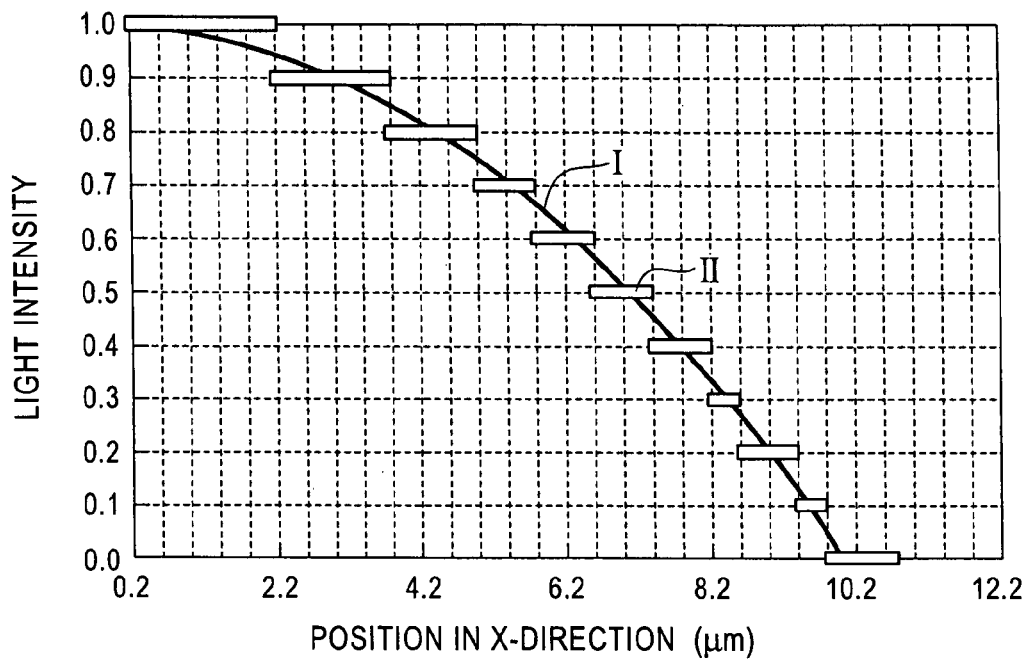
FIGS. 10A and 10B are views showing a distribution of intensity in once exposure and an average intensity in double-exposure.

FIG. 10A is a figure showing a light intensity at once exposure wherein an X-directional position (unit: µm) is taken on the axis of abscissa while a normalized light intensity is on the axis of ordinate. The curve line I represents a target light intensity. The rectangle II represents a light intensity through the mask arranged to obtain a target light-intensity distribution. As a result, a resolution of 0.4 µm is obtained in the X direction, i.e. in the horizontal direction. Meanwhile, 11 levels of resolution are obtained in increments/decrements of 0.1 with respect to the direction of light intensity, i.e. the direction of resist-film thickness.

Description is now made on the case to perform a multiple-exposure.

Figure 23:
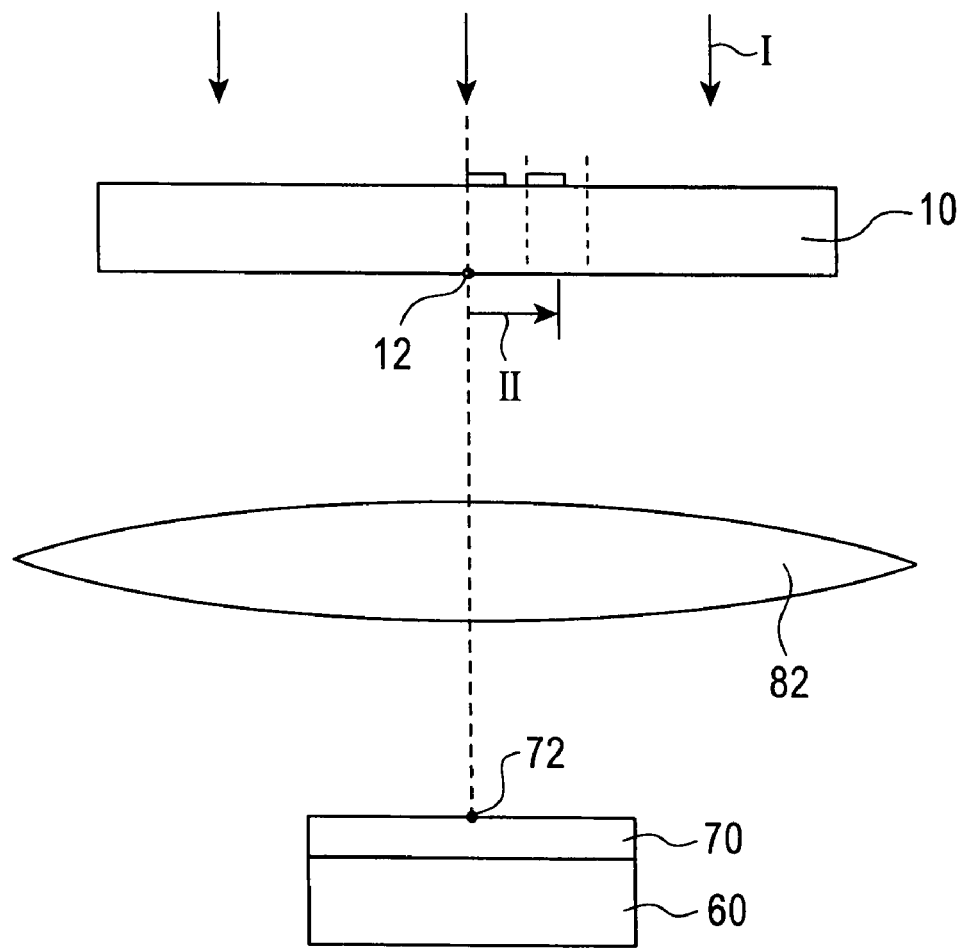
FIG. 23 is a view for explaining double-exposure.

In advance of explaining of multiple-exposure, description is first made on double-exposure while referring to FIG. 23. FIG. 23 is a figure for explaining double-exposure, which is a typical view as viewed from side.

A resist layer 70 is formed on an underlying layer 60. A photomask 10 is arranged such that the on-mask reference point 12 is aligned with an on-resist reference point 72 set on the resist layer 70.

In this state, reduction-projection exposure is performed as the first exposure through a lens 82. The light used in the exposure is shown at arrow I in the figure.

Then, after moving the photomask 10 in the X direction (in the direction shown at arrow II in the figure), reduction projection exposure is performed as the second exposure through the lens 82.

When performing the double-exposure based on the first and second exposures, the exposure time of each of the first and second exposures is given a half of that of an once exposure.

Figure 10B:
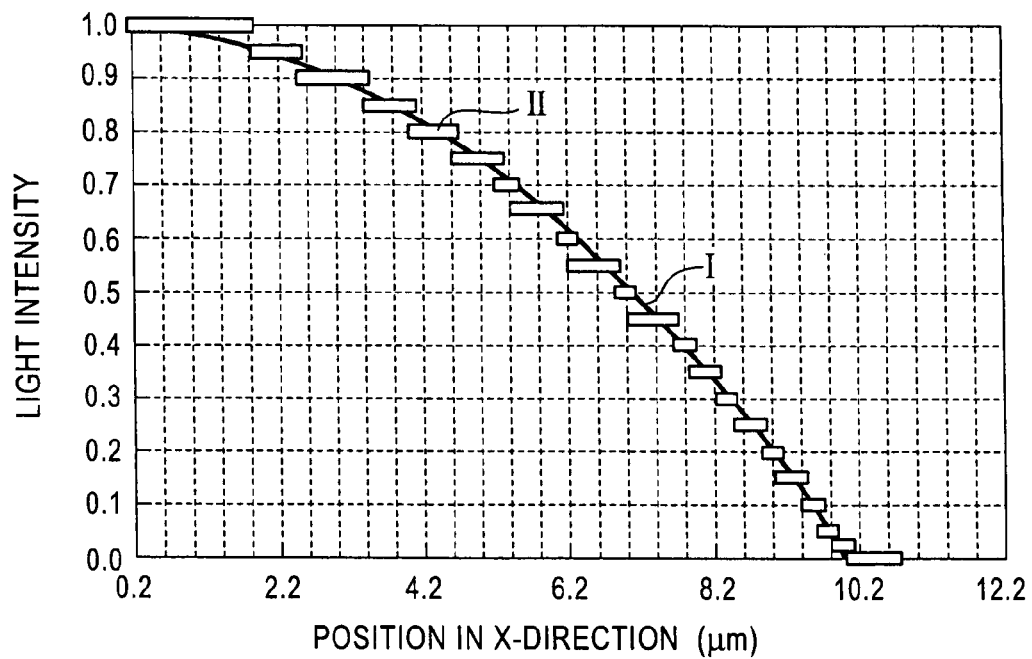

FIG. 10B is a view showing the average light intensity of the double-exposure, showing a light-intensity distribution when performing exposure by moving the photomask a distance 1.5 times one-side length (mask pitch) P of the mask cell. In FIG. 10B, an X-directional position (unit: µm) is taken on the axis of abscissa while a normalized light intensity is on the axis of ordinate. The curve line I represents a target light intensity. The rectangle II represents an average light intensity when performing the double-exposure through the mask arranged to obtain a target light-intensity distribution. By the double-exposure, a horizontal resolution is provided 0.2 µm that is a half of once exposure. As for the light intensity, resolution is obtained in 21 levels in increments/decrements of 0.05.

Incidentally, the effect of double-exposure depends upon the amount of shift of the mask position. In a region that the resist surface formed has a small inclination where the mask cells of the same area ratio continue, the resolution is improved when the shift amount is larger. On the contrary, in a region where inclination is greater, the resolution possibly deteriorates when the shift amount increases. Accordingly, the square sum, of the differences between target resist-film thicknesses and formed resist-film thicknesses, takes a minimum value at a certain amount of shift.

Figure 11:
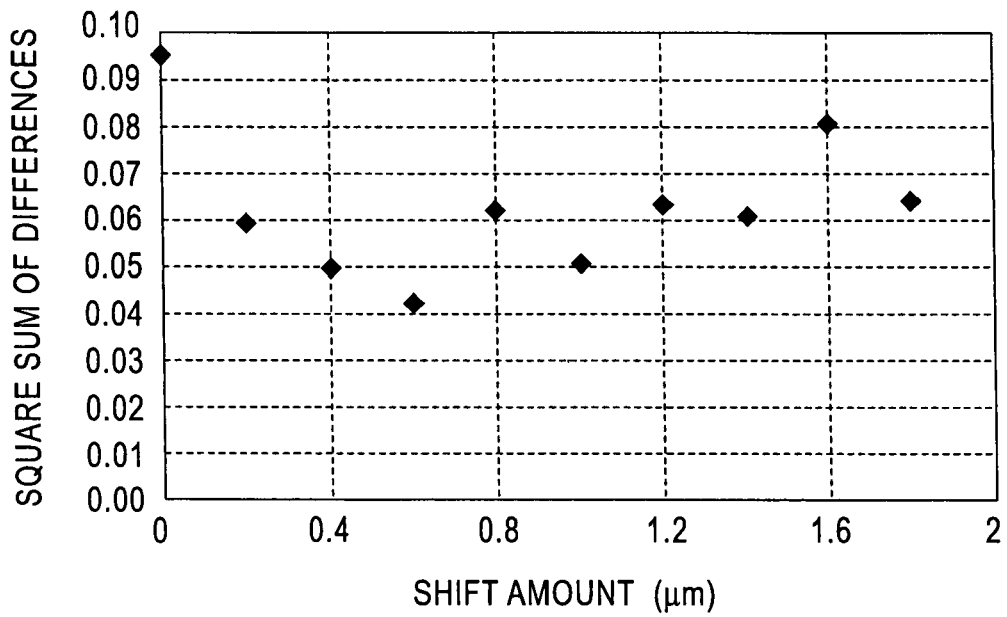
FIG. 11 is a view showing a relationship, in double-exposure, between a shift amount of photomask and a square sum over the differences between a target resist-film thickness and a formed-resist-film thickness.

FIG. 11 is a figure showing a relationship, in the double-exposure, between a shift amount of the photomask and a square sum of the differences between target resist-film thicknesses and formed resist-film thicknesses. In FIG. 11, a shift amount (unit: μm) is taken on the axis of abscissa while a square sum, over the differences between target resist-film thicknesses and formed resist-film thicknesses, is on the axis of ordinate. Here, although the minimum is attained when the amount of shift is 0.6 μm in terms of the dimension on the resist, i.e. when it is 1.5 times the mask pitch P, improvement can be obtained even unless the amount of shift is based on ½ unit (i.e., on the basis of a half of the mask pitch P). However, it is desirably based on ½ unit upon double-exposure in order to perform averaging uniformly. There are cases to obtain an improving effect even at even-number times a half of the mask pitch P, i.e. integer times the mask pitch P. However, in this case, no improvement is available in the X-directional resolution. In order to obtain a resolution in the X direction, the amount of shift is suitably taken an odd-number times (integer+a half) the mask pitch P.

In a similar manner, when performing n-times of multiple-exposure, by performing exposures n times while shifting a distance of one-n-th (1/n) of the on-resist pitch per time in the X direction, resolution can be improved to one-n-th as to X-directional position and light intensity. Likewise the case of the double-exposure, although the resolution possibly improves even unless the shift is not based on 1/n unit of the on-resist-pitch, it is preferably based on 1/n unit in order to achieve uniform averaging.

In order to obtain a two-dimensional effect in X and Y directions, the photomask is shifted by a distance of 1/n of the on-resist-pitch in the X and Y directions to perform $n^2$ times of multiple-exposure. In this case, the resolution is improved to 1/n in each of the X and Y directions and to $1/n^2$ in the Z direction.

Description is now made on the case of n=2 in $n^2$ times of multiple-exposure, i.e. quadruple-exposure, wherein effect can be obtained two-dimensionally.

For quadruple-exposure, a photomask is set similarly to the case of the usual once exposure, and the first exposure is performed with an exposure time which is a quarter of that for once exposure. Thereafter, the on-mask reference point is aligned with a position which is distant from the optical reference point by 1.5 times of the mask pitch P in the X direction, and the second exposure is performed with an exposure time which is a quarter of that for once exposure. Then, the on-mask reference point is aligned with a position which is distant from the optical reference point by 1.5 times of the mask pitch P in the Y direction, and the third exposure is performed with an exposure time which is a quarter of that for once exposure. Furthermore, the on-mask reference point is aligned with a position which is distant from the optical reference point by 1.5 times of the mask pitch P in the X and Y directions, and the fourth exposure is performed with an exposure time which is a quarter of that for once exposure.

Figure 12:
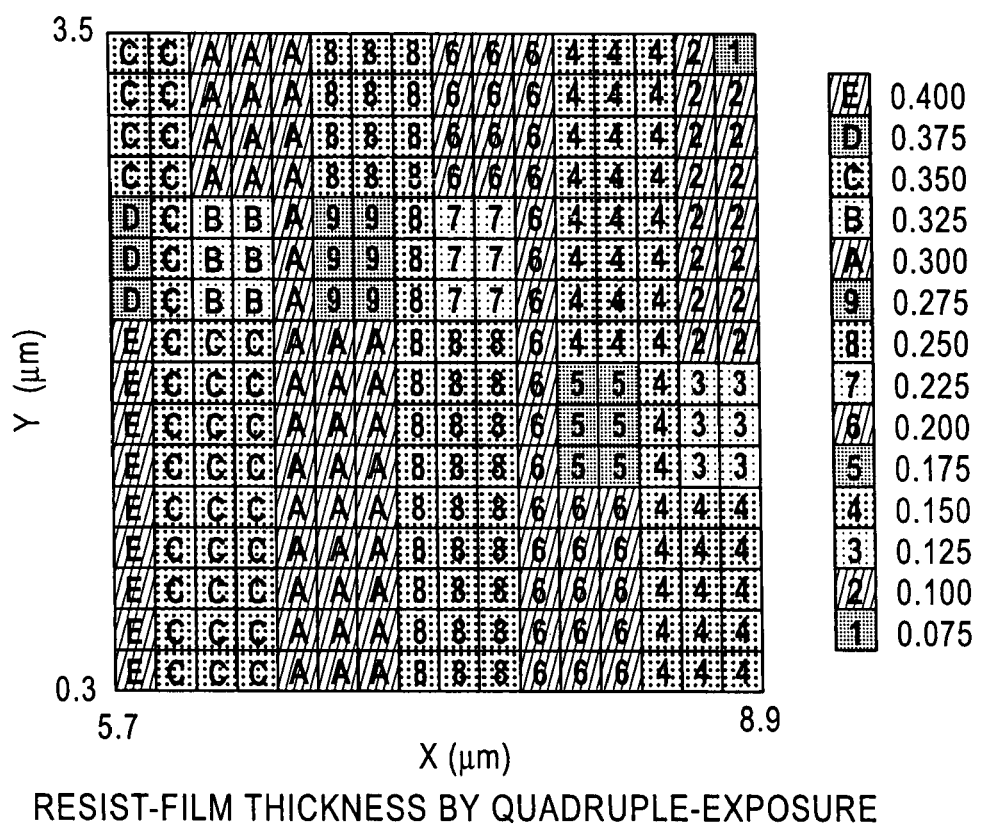
FIG. 12 is a contour map showing a resist-film thickness obtained by exposure and development where quadruple-exposure is done.

FIG. 12 is a contour map showing a resist-film thickness obtained by exposure and development when performing the quadruple-exposure. In FIG. 12, there is shown a region given by X=5.7-8.9 and Y=0.3-3.5. As a result, a resolution of 0.2 μm, i.e. of a half of the pitch, is obtained in the X and Y directions. In the Z direction, i.e. in the direction of resist-film thickness, the minimal step of light intensity is given 0.025 that is a quarter of 0.1, thus 41 levels of resolution can be obtained.

In the range shown in FIG. 12, the square sum over the differences between target values and measurement values of the resist-film thickness is calculated to be 78.0. On the contrary, the square sum over the differences between target values and measurement values of the resist-film thickness is 230.7, which is obtained in the same range when once exposure is performed using the same mask. In this manner, the square sum over the differences is improved by implementing the quadruple-exposure, thus obtaining a resist pattern more approximate to the target.

Incidentally, description was made herein on the example that shift is made a distance of 1.5 times the one-side length of the mask cell, i.e. the mask pitch P, with respect to the optical reference point. However, the amount of shift is not limited to the example. The shift amount of the photomask may be set at a value at which minimized is the square sum over the differences between target resist-film thicknesses and resist-film thicknesses of the formed resist pattern.

For example, the process may be implemented with a step of exposure by shifting the on-mask reference point a distance of (m+½) times (m: integer of 0 or 1 or greater) the mask pitch P in the X direction from the coordinate origin, a step of exposure by shifting the on-mask reference point a distance of (m+½) times the mask pitch P in the Y direction from the coordinate origin, and a step of exposure by shifting the on-mask reference point a distance of (m+½) times the mask pitch P in the X and Y directions from the coordinate origin.

When performing $n^2$-times of multiple-exposure, the shift amount of the photomask is not limited to a value of 1/n times the mask pitch P but may be set at a value of 1/n+m (m: integer of 0 or 1 or greater) at which minimized is the square sum over the differences between target resist-film thicknesses and resist-film thicknesses of the formed resist pattern. In this case, by taking on-photomask position corresponding to the on-resist reference point set on the resist as a coordinate origin, the Y-coordinate is shifted in increments/decrements of P×(1/n+m) from 0 to P×(1/n+m)×(n−1) while the X-coordinate is shifted in increments/decrements of P×(1/n+m) from 0 to P×(1/n+m)×(n−1) relative to the each of the Y-coordinates so that exposure can be made by aligning the on-on-mask reference point with a position as indicated by X and Y coordinates.

Other Embodiments of Resist Pattern Forming Method with Multiple-Exposure

In the following, the on-resist pitch is assumed 400 nm and a mask minimal dimension is 150 nm in order to simplify the description for the effect of the multiple-exposure. The resist-film thickness is assumed 3.5 μm. As shown in FIG. 7, the resist is assumed to be a positive type having a linear dissolving characteristic in a space width range of 150-250 nm.

Provided that the minimal dimensional increment/decrement of the space width is taken 10 nm, the normalized resist-film thickness can be adjusted in 11 levels in increments/decrements of 0.1 from 0 to 1.

At first, on the resist, a plurality of resist cells same in size and square in form are set by a plurality of virtual grid lines drawn in the mutually-orthogonal X and Y directions, whose one side length is smaller than the length defining a resolution limit of the optical system of an exposure equipment for which a photomask is used.

Then, virtual divisional lines are drawn parallel with the on-resist virtual grid lines, to divide the resist cells in the X and Y directions into equal n parts, thus providing sub-resist-cells in the number of $n^2$. Although n may be given an integer equal to or greater than 2, description is made here by taking n as 2 for simplicity.

Figure 13:
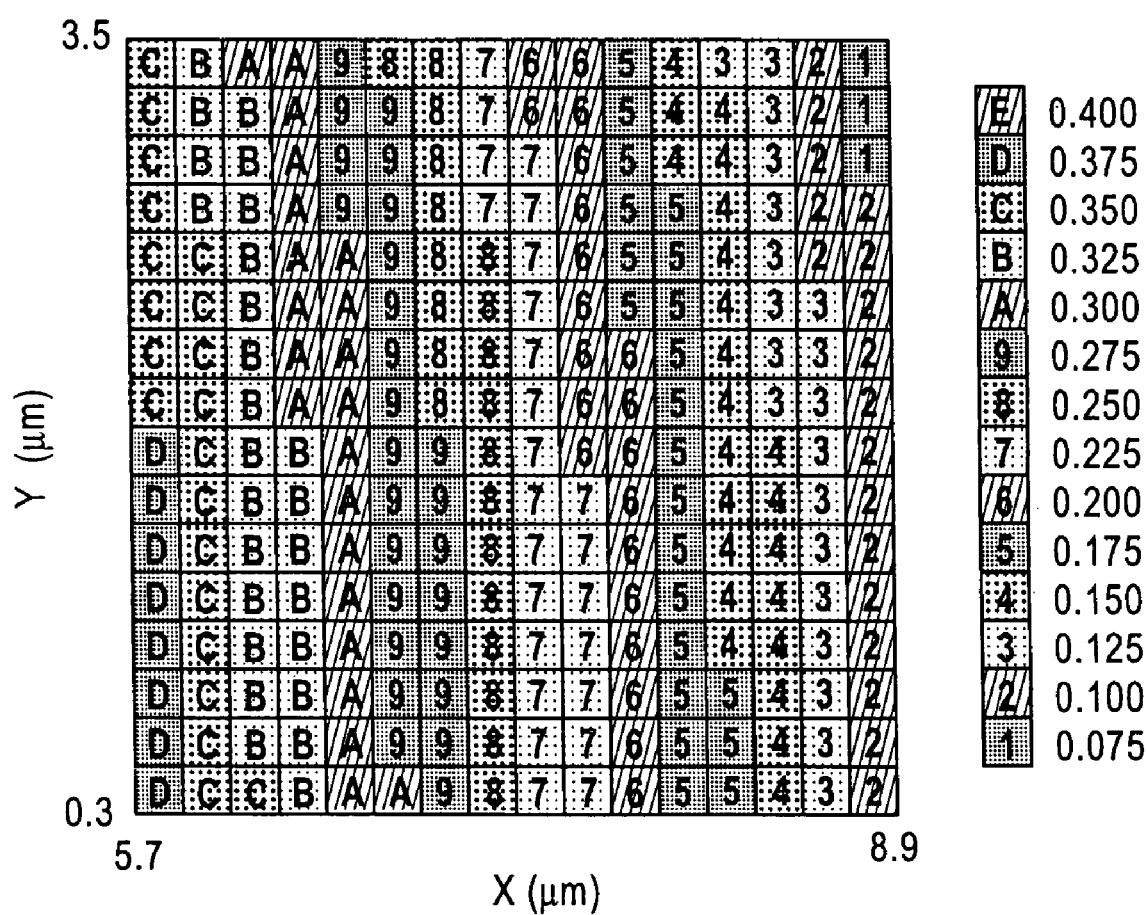
FIG. 13 is a contour map of resist-film thickness of a lens outer peripheral region where the rate of change is great.
Figure 14A:
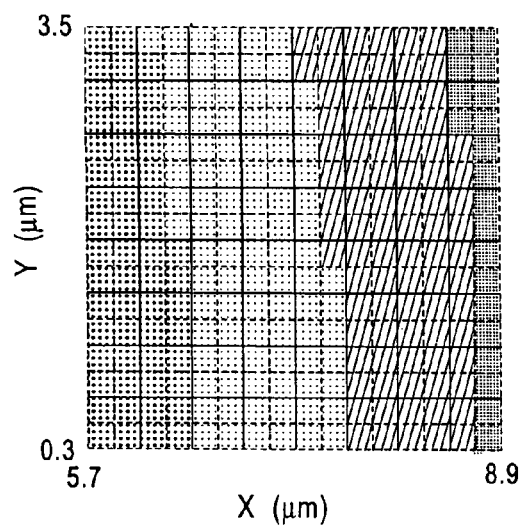
FIGS. 14A-14D are views showing preparatory cell intensities provided to the first, second, third and fourth mask substrates.
Figure 14B:
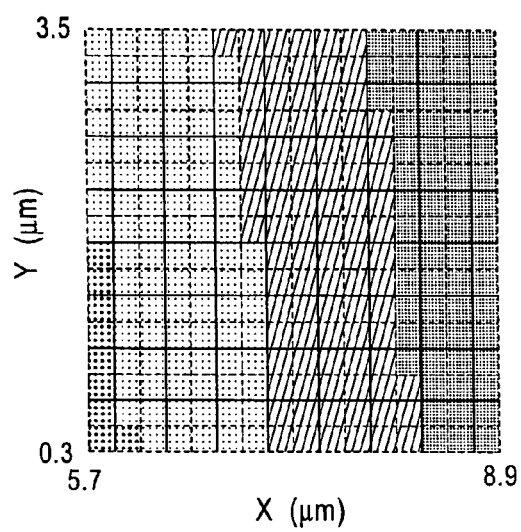
Figure 14C:
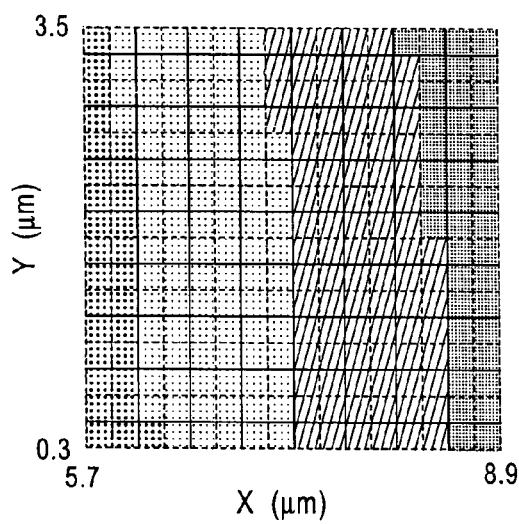
Figure 14D:
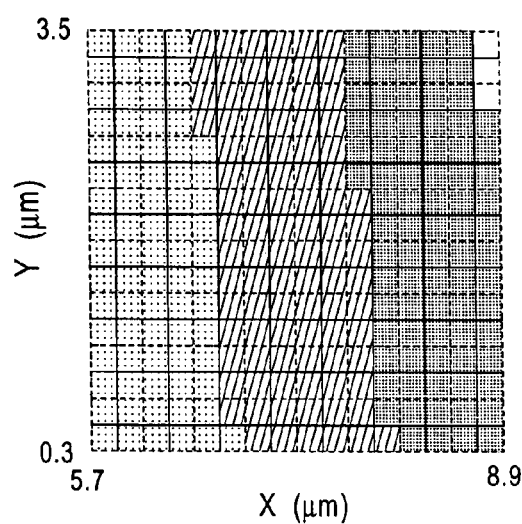
Figure 14D:
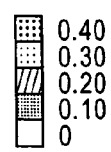
Figure 15A:
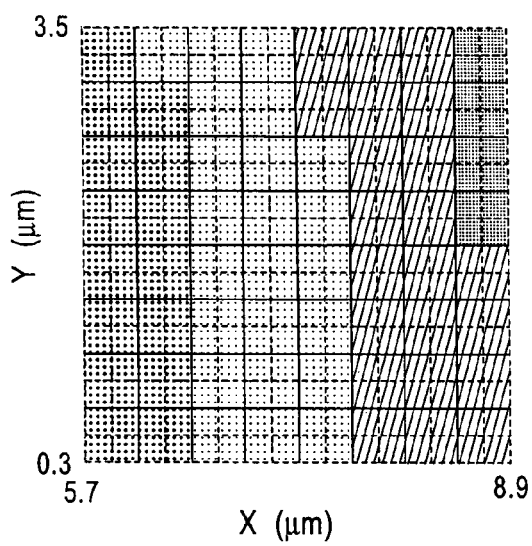
FIGS. 15A-15D are views showing preparatory cell intensities after unified the first, second, third and fourth mask substrates.
Figure 15B:
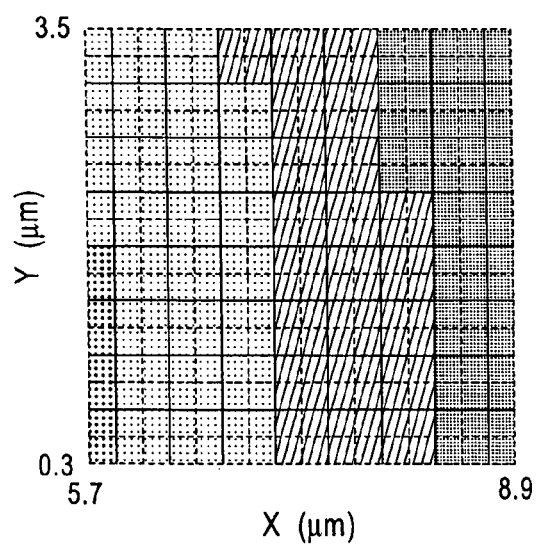
Figure 15C:
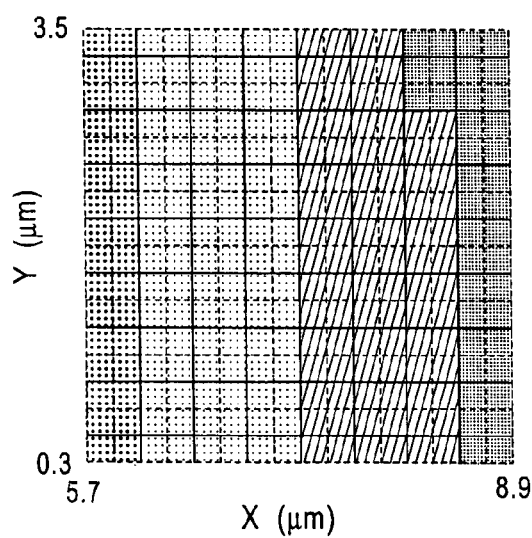
Figure 15D:
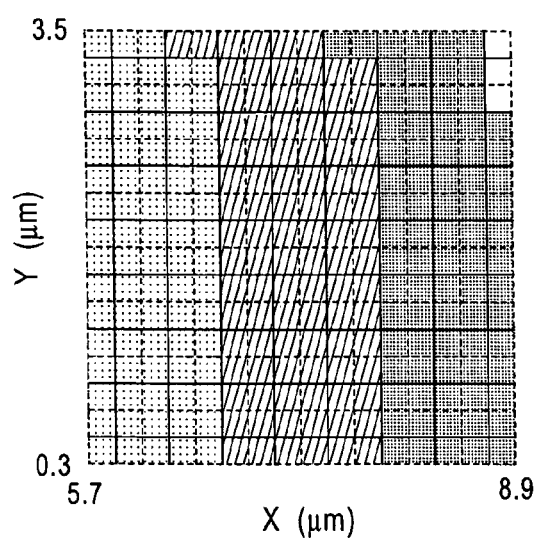
Figure 15D:
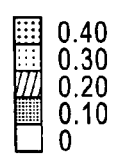

Then, a subcell intensity, i.e. a light intensity for a sub-resist-cell, is set in units of $1/n^2=¼$ of a cell intensity, in a manner corresponding to a resist-film thickness of the sub-resist-cell. Here, the subcell intensity is provided in 41 levels because the cell intensity is in 11 levels. FIG. 13 is a contour map of resist-film thickness showing, by selecting, the range given by X=5.7-8.9 and Y=0.3-3.5 in a lens outer peripheral portion having a greater change rate. The sub-resist-cell has one-side length of 0.2 μm because 0.4-μm resist cells are divided into equal two parts with respect to X and Y directions.

Then, preparatory cell intensities are set for each of the sub-resist-cell. The preparatory cell intensities are provided as a set of values in the number of $n^2$. The preparatory cell intensities are provided to have values around the subcell intensity in units of cell intensity and having an average value given as the subcell intensity. For example, where n=2 and the sub-resist-cell has a resist-film thickness value of 0.375, the preparatory cell intensities are four values of 0.4, 0.4, 0.4 and 0.3.

A virtual mask plane is provided in a position where the photomask is used. By drawing a plurality of straight lines in the X and Y directions orthogonal to each other, a plurality of cells equal in size and square in form are set on the mask plane, whose one side length is smaller than the length of the resolution limit of the optical system of the exposure equipment for which the photomask is used.

Then, by drawing virtual divisional lines parallel with the X and Y direction on the mask plane, the cells are divided in X and Y directions into equal parts in the number of n, thus setting subcells in the number of $n^2$. Here, four subcells are set because n is taken 2. Thus, preparatory cell intensities are provided as a set of four values as to the sub-resist-cells corresponding to the relevant subcells.

Then, the first to fourth mask substrates are prepared in this embodiment, as the first to $n^2$-th mask substrate. For each of the first to fourth mask substrates, a plurality of straight lines are drawn mutually orthogonally, thereby setting mask cells corresponding to the cell. By drawing virtual divisional lines in the X and Y directions, sub-mask-cells are set corresponding to the subcells. Furthermore, an on-mask reference point is set on each of the first to fourth mask substrates.

Then, the first mask substrate at its on-mask reference point is aligned with the coordinate origin. The second mask substrate at its on-mask reference point is aligned with a position which is a shifted position by a distance of a half of the mask pitch P in the X direction from the coordinate origin. The third mask substrate at its on-mask reference point is aligned with a position which is a shifted position by a distance of a half of the mask pitch P in the Y direction from the coordinate origin. The fourth mask substrate at its on-mask reference point is aligned with a position which is a shifted position by a distance of a half of the mask pitch P in the X and Y directions from the coordinate origin.

Then, the sub-mask-cells of the first to fourth mask substrates are provided with preparatory cell intensities of the corresponding subcells in the greater order. FIGS. 14A, 14B, 14C and 14D are views showing the preparatory cell intensities provided to the first to fourth mask substrates.

Then, one of the preparatory cell intensities, of the sub-mask-cells belonging to each mask cell, is selected as a cell intensity. This is because the photomask actually fabricated is based on a mask cell as a minimal unit and hence different light intensities are not allowed for the sub-mask-cells belonging to one mask cell. Here, by taking as a cell intensity one of the preparatory cell intensities of the sub-mask-cells belonging to the mask cell, selected is a value at which minimized is the square sum over the differences for a target form and a film thickness. Incidentally, when correction is required, i.e. there occurs interference between the mask cell areas having a plurality of preparatory cell intensities, examination is preferably made on all the possible combinations as to a plurality of mask substrates, to select a combination of values approximate to the target form.

FIGS. 15A, 15B, 15C and 15D are views showing unified light intensities of the first, second, third and fourth mask substrates.

Thereafter, any one or both of light-transmission and shade areas are set on each of the mask cells. By performing a process step of providing, as a cell intensity, an intensity of light to transmit through each mask cell, and a process step of forming a shade film over the shade areas of the mask substrate, thereby obtaining first to fourth photomasks.

Then, exposure is performed by aligning the on-mask reference point set on the first photomask with the coordinate origin. Exposure is performed by aligning the on-mask reference point set on the second photomask with a position which is a shifted position by a distance of ½ times the mask pitch P in the X direction from the coordinate origin. Exposure is performed by aligning the on-mask reference point set on the third photomask with a position which is a shifted position by a distance of ½ times the mask pitch P in the Y direction from the coordinate origin. Then, exposure is performed by aligning the on-mask reference point set on the fourth photomask with a position which is a shifted position by a distance of ½ times the mask pitch P in the X and Y directions from the coordinate origin.

For simplicity, description is first made on the effect of double-exposure with using the first and second photomasks.

Figure 16A:
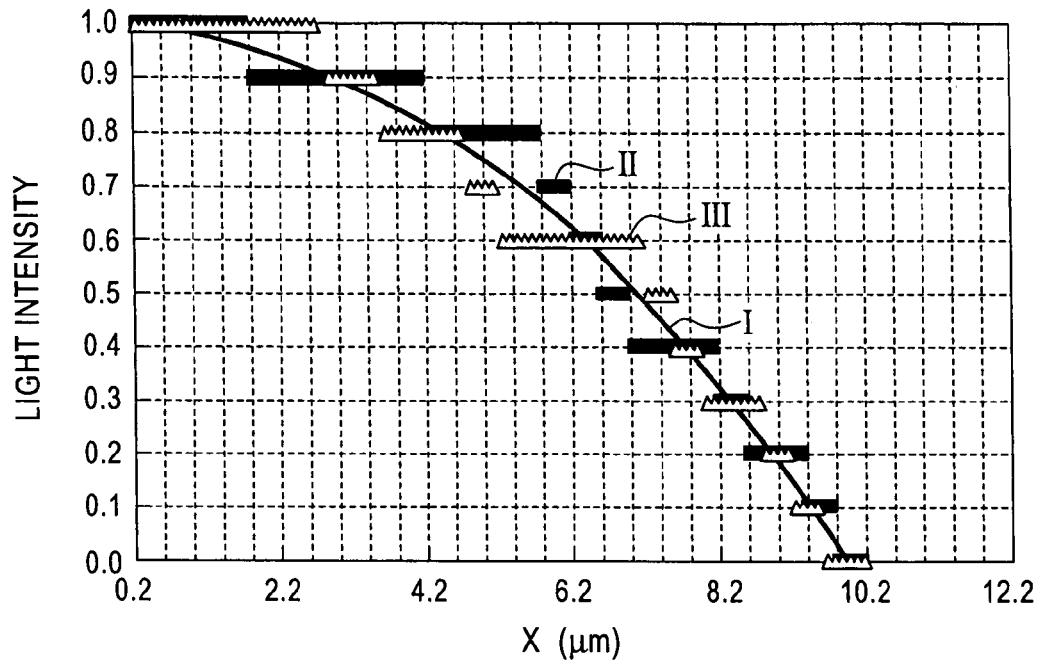
FIGS. 16A and 16B are views showing an intensity in once exposure and an average intensity in double-exposure using two photomasks.

FIG. 16A is a view showing a light intensity when once exposures are performed respectively by using the first and second photomasks. In the figure, an X-directional position is taken on the axis of abscissa while a normalized light intensity is on the axis of ordinate. The curve line I represents a target light intensity. The portion attached with reference II represents the case the first photomask is used while the portion attached with reference III represents the case the second photomask is used.

Figure 16B:
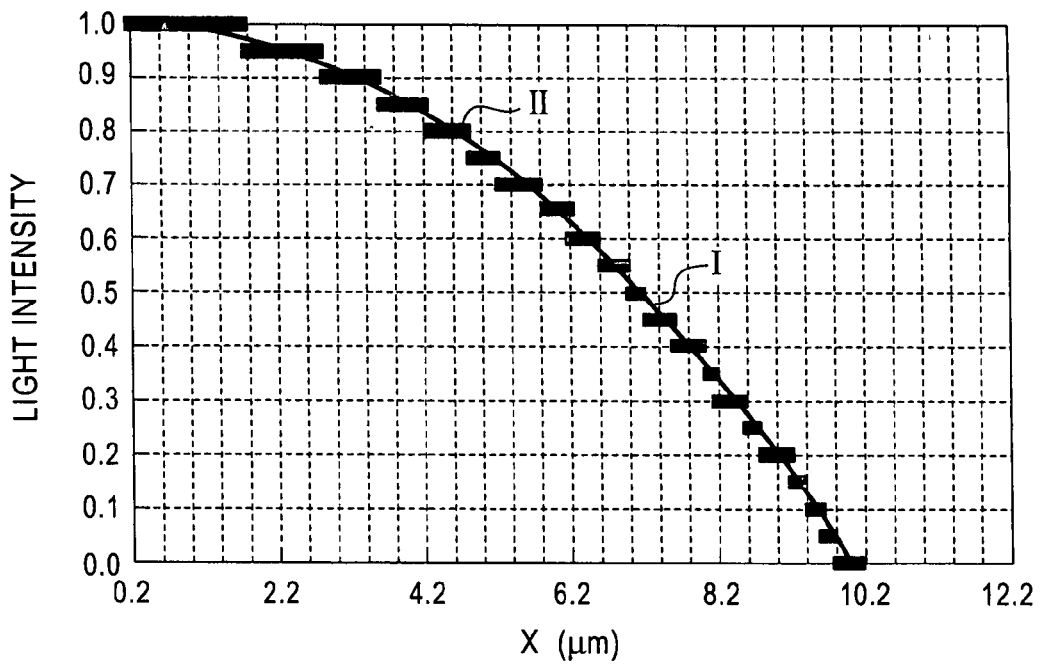

On the contrary, FIG. 16B is a figure showing an average light intensity of the double-exposure with using the first and second photomasks. In FIG. 16B, an X-directional position is taken on the axis of abscissa while a normalized light intensity is on the axis of ordinate. The curve line I represents a target light intensity. The rectangle II represents the average light intensity when double-exposure is performed by using, in order, the first and second photomasks. By double-exposure, obtained is the horizontal resolution of 0.2 μm that is a half of that of once exposure. For light intensity, 11 levels of resolution are obtained in increments/decrements of 0.05.

Description is now made on the effect when quadruple-exposure is performed with using the first to fourth photomasks.

Figure 17A:
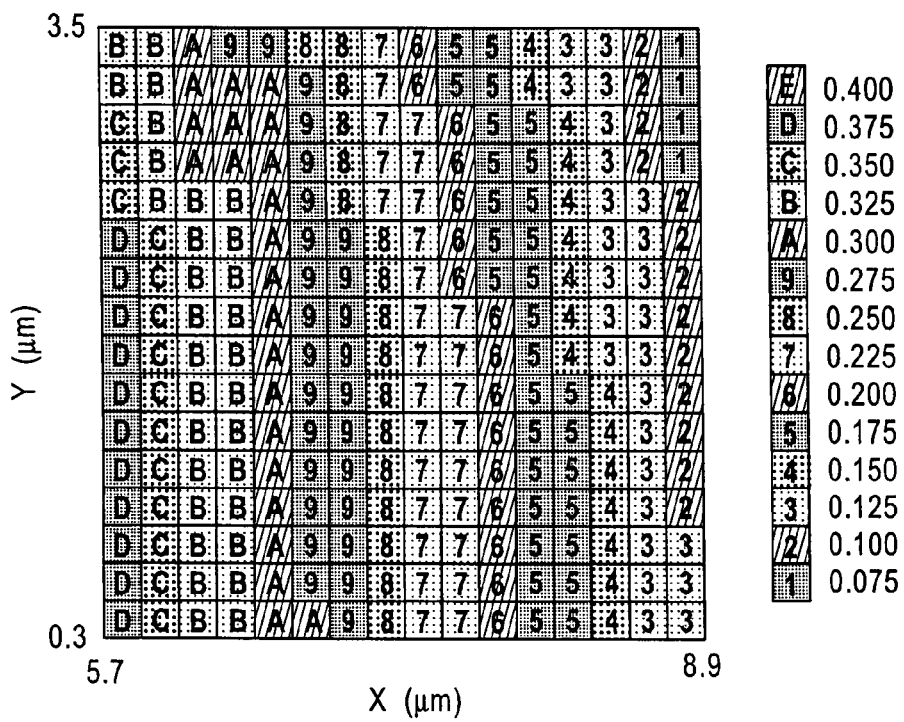
FIGS. 17A and 17B are contour maps showing a resist-film thickness distribution obtained as a result of quadruple-exposure using the first to fourth photomasks and a contour map showing a difference between a target form and an obtained form.

FIG. 17A is a contour map showing a distribution of resist-film thickness obtained as a result of performing quadruple-exposure with using the first to fourth photomasks. As shown in FIG. 17A, the minimal pitch is 0.2 μm, i.e. a half of that in once exposure, in the X and Y directions while the minimal step of film thickness is 0.025, i.e. a quarter of that of once exposure. In this case, the square sum over the differences between the respective values for a target form and an obtained form is 32.2. Besides improved over 230.7 of once exposure, improvement is further achieved over 78.0 of the quadruple-exposure using one photomask.

Figure 17B:
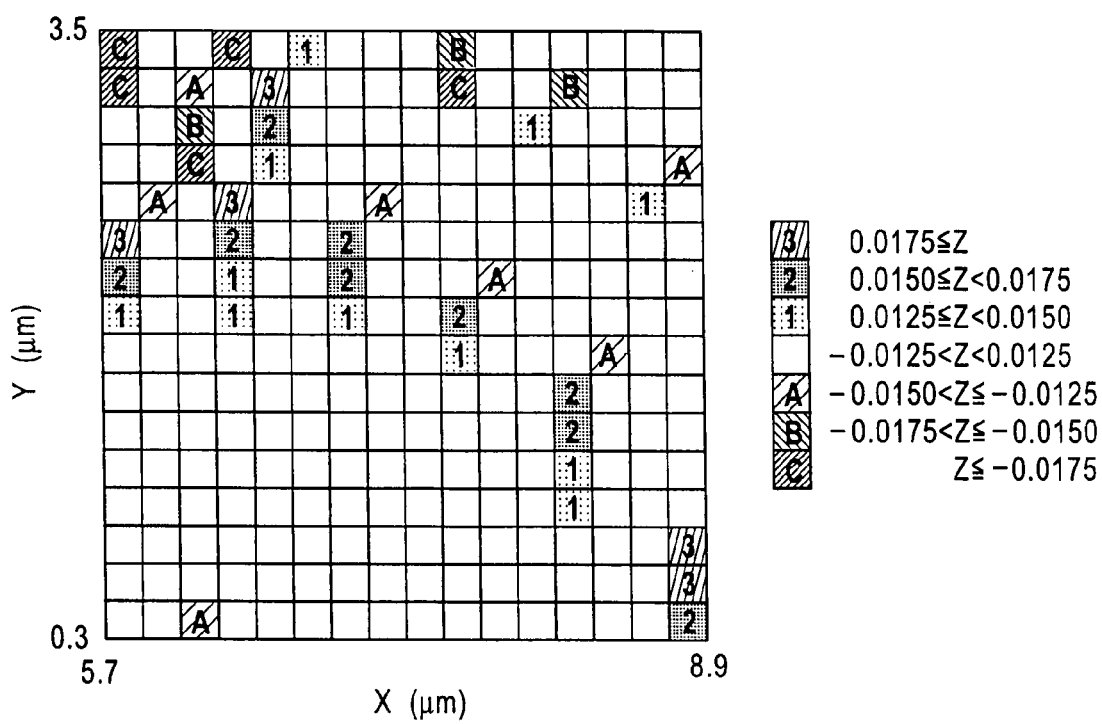
Figure 19A:
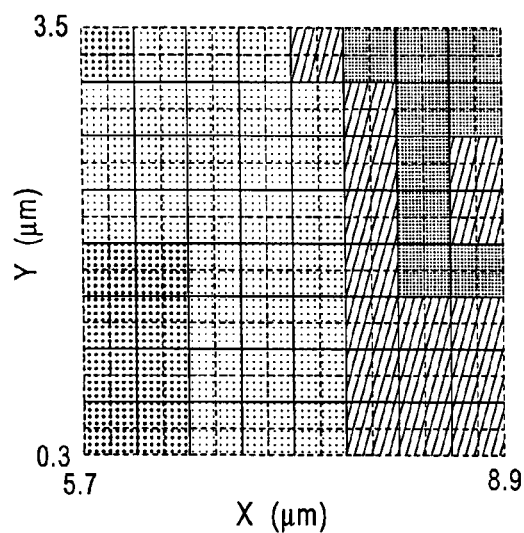
FIGS. 19A-19D are views showing a result of correction of the mask pattern.
Figure 19C:
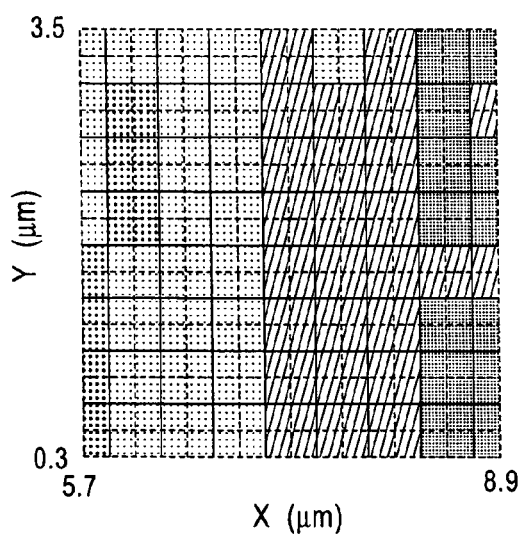
Figure 19B:
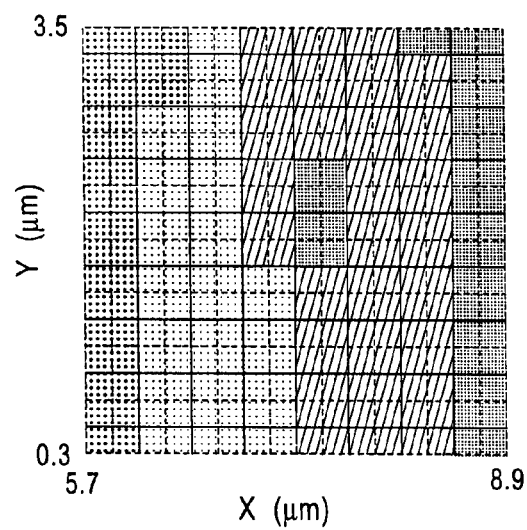
Figure 19D:
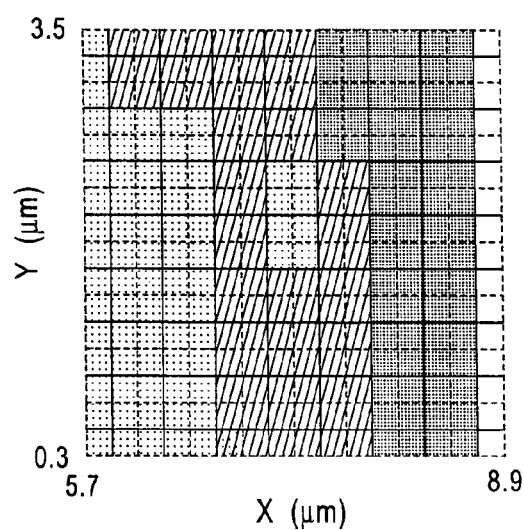
Figure 19D:
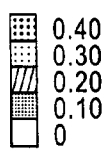

FIG. 17B is a contour map showing the differences for a target form and an obtained form. As shown in FIG. 17B, there are collective occurrences of the areas in which the difference is in a positive value and of the mask cells in which the difference is in a negative value. This is due to the restriction that preparatory cell intensities must be unified within the mask cell.

In the case of the quadruple-exposure, changing the cell intensity one level (0.1, herein) within any one photomask corresponds to a correction of 0.025 to the resist-film thickness. Accordingly, when there are collectively a plurality of areas the difference in absolute value is over 0.0125 (=0.025/ 2), there is a possibility that correction is possible to reduce the difference.

FIGS. 18A-18I are schematic views for explaining the corrections to the mask. The mask cells each have four sub-mask-cells.

FIG. 18A shows the case to correct one mask cell, having sub-mask-cells (1, 1), (1, 2), (2, 1) and (2, 2) in the first photomask, such that the light intensity becomes positive. FIG. 18B shows the case to correct one mask cell, having sub-mask-cells (2, 1), (2, 2), (3, 1) and (3, 2) in the second photomask, such that the light intensity becomes negative.

FIG. 18C shows the case where exposure was performed by using the first and second photomasks corrected. In this case, correction is done so that (1, 1) and (1, 2) are corrected to be positive, and that (3, 1) and (3, 2) are corrected to be negative, while no correction is done as to (2, 1) and (2, 2) because of cancellation.

FIG. 18D shows the case to correct light intensities so as to be positive for the mask cell having sub-mask-cells (1, 1), (1, 2), (2, 1) and (2, 2) and for the mask cell having sub-mask-cells (3, 1), (3, 2), (4, 1) and (4, 2), in the first photomask. FIG. 18E shows the case to correct light intensity so as to be negative for the mask cell having sub-mask-cells (2, 1), (2, 2), (3, 1) and (3, 2) in the second photomask.

FIG. 18F shows the case that exposure was performed by using the first and second photomasks corrected. In this case, correction is done so that (1, 1), (1, 2), (4, 1) and (4, 2) are corrected to be positive, while no correction is done for (2, 1), (2, 2), (3, 1) and (3, 2) because of cancellation.

FIG. 18G shows the case to correct light intensities so as to be positive for the mask cell having sub-mask-cells (1, 1), (1, 2), (2, 1) and (2, 2) in the first photomask. FIG. 18H shows the case to correct light intensities so as to be negative for the mask cell having sub-mask-cells (2, 2), (2, 3), (3, 2) and (3, 3) in the fourth photomask.

FIG. 18I shows a case that exposure was done by using the first and fourth photomasks corrected. In this case, correction is done such that (1, 1), (1, 2) and (2, 1) are corrected to be positive, and that (3, 2), (2, 3) and (3, 3) are corrected to be negative, while no correction is done for (2, 2) because of cancellation.

The mask patterns were corrected by this technique, the result of which is shown in FIGS. 19A, 19B, 19C and 19D.

Figure 20A:
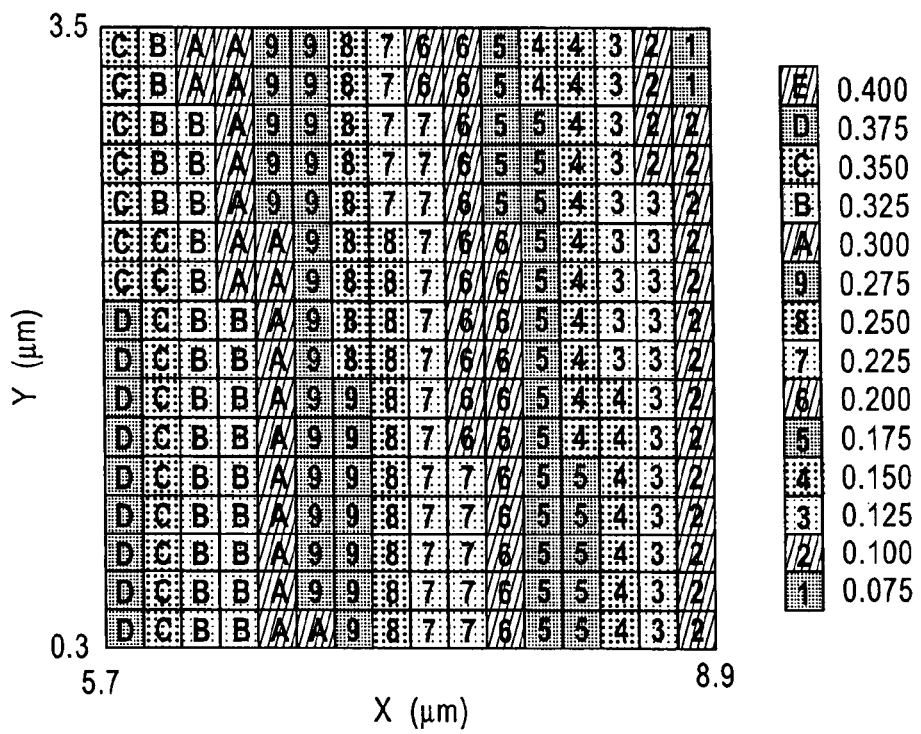
FIGS. 20A and 20B are views showing a result of quadruple-exposure by using a corrected photomask.
Figure 20B:
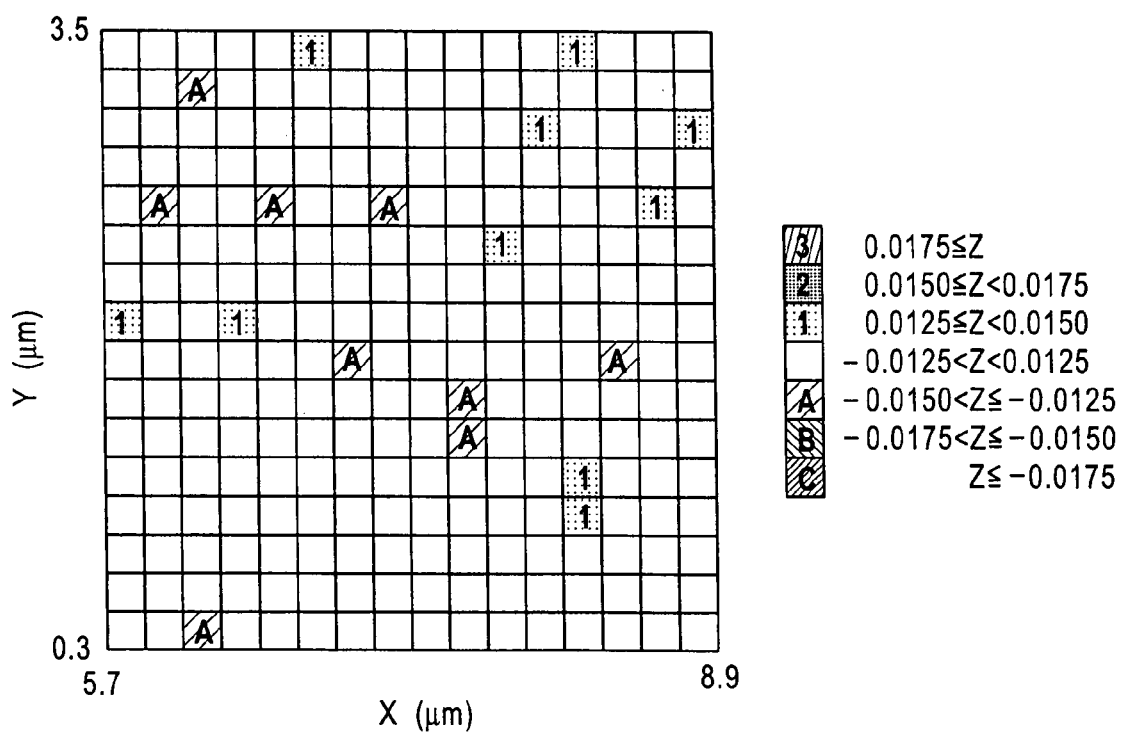

Quadruple-exposure was done by using the corrected photomasks, the result of which is shown in FIGS. 20A and 20B. FIG. 20A is a contour map showing a distribution of resist-film thickness resulting from the quadruple-exposure with using the corrected photomask. FIG. 20B is a view showing differences for a target form and an obtained form. The sum over the differences from the target values is given as 25.1. For each of the sub-resist, there are eliminated areas where absolute value of the difference is over 0.015. Thus, a resist pattern can be obtained which is more approximate to the target form.

In a case when multiple-exposure is done by use of one photomask, the optimal amount of shift is different because of the inclination of a curved surface, so that there will be a case in which correction is not to be done optimally. However, with four photomasks, the optimal averaging effect can be obtained over the entire pattern regardless of the inclination in the curved surface.

Incidentally, in the case of performing multiple-exposure by use of the first to $n^2$-th photomasks and obtaining the resolution in the X and Y directions to a fully extent even by once exposure, the on-mask reference point may be aligned with the coordinate origin upon providing preparatory cell intensities to the sub-mask-cells of the first to $n^2$-th mask substrate. In this case, exposure process is performed by aligning the on-mask reference point of each photomask with the coordinate origin.

According to the structures of the above-described embodiments, the exposure field, where once exposure is available, is nearly in a size of 22 mm square. Accordingly, with a resist pattern having a diameter of 250 μm, a resist pattern can be efficiently formed by arranging a plurality of mask patterns over the mask.

Figure 21A:
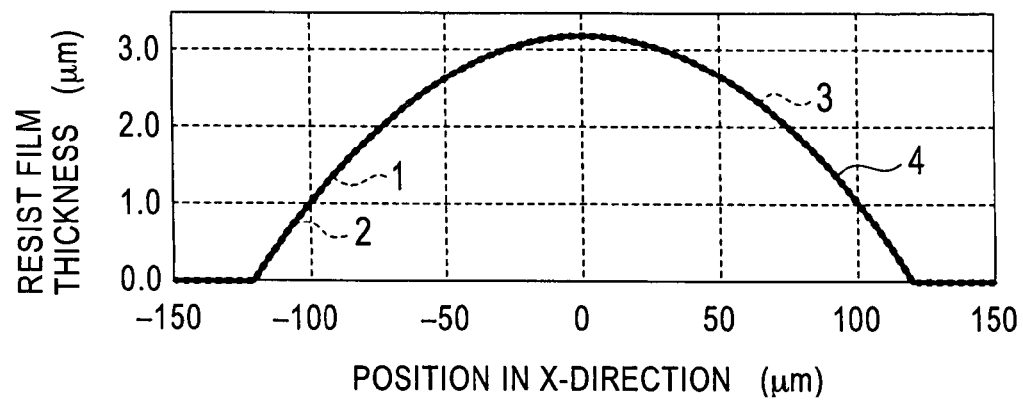
FIGS. 21A and 21B are views showing a result of forming a resist pattern by arranging the same form of mask patterns in four locations within one exposure field.
Figure 21B:
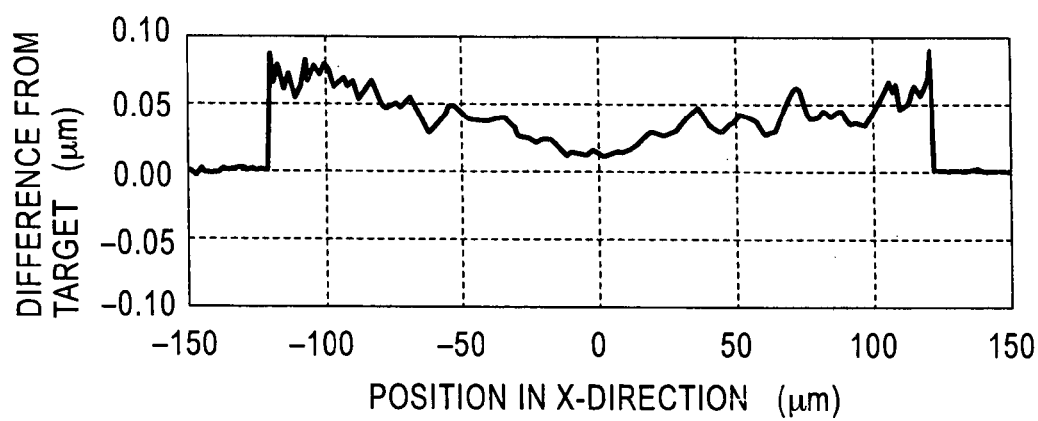

FIGS. 21A and 21B show a result of forming a resist pattern by arranging the same form of mask patterns in four locations within one exposure field. FIG. 21A shows a form of a resist pattern wherein an X-directional position, at a Y-directional coordinate of 0, is taken on the axis of abscissa while a resist-film thickness is on the axis of ordinate. FIG. 21B shows a variation in film thickness of the resist pattern wherein an X-directional position, at a Y-directional coordinate of 0, is taken on the axis of abscissa while a resist-film variation is on the axis of ordinate. Here, the variation in resist-film thickness uses the maximal and minimal values of resist-film thickness of the four resist patterns taken on the same coordinate. In this manner, it can be seen that, even when using the same form of mask patterns, there is caused a variation in film thickness exceeding 50 nm. This can be considered due to the variation in mask dimensions introduced during fabricating the mask, the variation in illumination in the exposure field, the deformation of the resist pattern due to thermal processing and so on. In case the cause of such variations in resist-film thickness is specified and the specified cause is reproducible, correction is possible to effect by a mask-pattern arrangement.

Note that the foregoing embodiments are mere exemplification of preferred embodiments and hence not limited to the descriptions thereof. In the description, i-line was used for exposure light wavelength. Alternatively, g-line (wavelength: 436 nm), KrF laser (wavelength: 248 nm), ArF laser (193 nm) or the like may be used.

Description was on the examples using the positive type of resist. Alternatively, a negative type of resist may be used wherein the resist remaining film increases as the intensity of light increases.

The foregoing embodiments were described that the photomask is shifted in position during multiple-exposure so that exposure can be performed in each position. However, this is not limitative. In the multiple-exposure, it is satisfactory if the relative position of the resist and photomask is changed. Any of the substrate-to-process applied with resist and the photomask may be shifted in position or the both may be shifted in position.

According to the present invention, there are provided the following photomasks:

1) A photomask for exposing a resist layer provided on an underlying layer to light transmitting through the photomask so that a resist pattern can be formed changing in film thickness on the overlying layer by performing development, the photomask including: a transparent mask substrate; and a plurality of square mask cells set in rows and columns on a surface of the mask substrate by demarcating the surface by a plurality of straight lines orthogonal to each other at an equal interval, and respectively assigned with one of normalized light intensities, as an intensity of transmission light thereof, the normalized light intensities having three or more different values in which a maximum intensity of the transmission light is taken 1; wherein the mask cell has one side having a length provided smaller than a length of a resolution limit of an optical system of an exposure equipment for which the photomask is used; the mask cell having any one or both of a light-transmission area and a shade area formed by a shade film provided over the mask substrate, to determine an intensity of the transmission light by an area ratio of the light-transmission area to the mask cell; wherein when mask cells arranged successively in a column direction of the plurality of square mask cells have the shade areas, the shade areas are provided being connected in order continuously in the column direction; and when mask cells arranged successively in a row direction of the plurality of square mask cells have the light-transmission areas and the shade areas, the shade areas are provided being non-connected in order in the row direction.

2) A photomask according to 1), wherein each of the mask cells set with both light-transmission and shade areas is divided into equal two parts by a virtual divisional line drawn in the column direction, the light-transmission area being provided on one side of the virtual divisional line while the shade area being provided on other side of the virtual divisional line, the light-transmission areas of the mask cells being provided on the same side with respect to the virtual divisional line.

According to the present invention, there are provided the following methods:

3) A method of forming a resist pattern, upon forming a resist pattern having a film thickness changing on an underlying layer by use of a photomask according to 1) or 2), the method including a step for shifting an on-mask reference point set on the photomask in increments/decrements of $P\times(1/n+m)$ (P: one-side length of the mask cell, n: integer of 2 or greater, and m: integer of 0 or 1 or greater) in the column direction from 0 to $P\times(1/n+m)\times(n-1)$ and in increments/decrements of $P\times(1/n+m)$ in the row direction from 0 to $P\times(1/n+m)\times(n-1)$, provided that an on-photomask position corresponding to an on-resist reference point set on the resist layer is taken 0 in both row and column directions, to perform exposures at the respective positions in sequence.

4) A method of forming a resist pattern, upon forming a resist pattern having a film thickness changing on an underlying layer by use of a photomask according to 1) or 2), the method including a step of taking an on-photomask position corresponding to an on-resist reference point set on the resist layer as a coordinate origin and aligning the on-mask reference point set on the photomask with the coordinate origin to perform an exposure; a step of aligning the on-mask reference point with a position shifted a distance of k/2 (k: integer of 1 or greater) times the one-side length of the mask cell in the row direction from the coordinate origin to perform an exposure; a step of aligning the on-mask reference point with a position shifted a distance of k/2 times the one-side length of the mask cell in the column direction from the coordinate origin to perform an exposure; and a step of aligning the on-mask reference point with a position shifted a distance of k/2 times the one-side length of the mask cell in the row and column directions from the coordinate origin to perform an exposure.

5) A method of forming a resist pattern, upon forming a resist pattern having a film thickness changing on an underlying layer by use of a photomask according to 1) or 2), the method including a step of taking an on-photomask position corresponding to an on-resist reference point set on the resist layer as a coordinate origin and aligning the on-mask reference point set on the photomask with the coordinate origin to perform an exposure; a step of aligning the on-mask reference point with a position shifted a distance of (m+½) (m: integer of 0 or 1 or greater) times the one-side length of the mask cell in the row direction from the coordinate origin to perform an exposure; a step of aligning the on-mask reference point with a position shifted a distance of (m+½) times the one-side length of the mask cell in the column direction from the coordinate origin to perform an exposure; and a step of aligning the on-mask reference point with a position shifted a distance of (m+½) times the one-side length of the mask cell in the row and column directions from the coordinate origin to perform an exposure.

6) A method of forming a resist pattern, upon forming a resist pattern having a film thickness changing on an underlying layer, the method including a step of providing a virtual mask plane having a coordinate origin in a position corresponding to an on-resist reference point set on the resist, in a position where to use a photomask; a step of setting a plurality of square mask cells in rows and columns by demarcating the mask plane by a plurality of straight lines orthogonal to each other at an equal interval, each of which has one side having a length provided smaller than a length of a resolution limit of an optical system of an exposure equipment for which the photomask is used; a step of setting four subcells by drawing virtual divisional lines in row and column directions and dividing each of the cells into two equal parts with respect to the row and column directions; a step of setting film thickness of the resist layer for positions corresponding to each of the subcells; a step of setting one of normalized light intensities of light transmitting through the subcells as a subcell intensity, the subcell intensity corresponding to the film thickness, the normalized light intensities having three or more different values in which a maximum value of the light transmitting through the subcells is normalized to 1; a step of setting each of the subcells with a preparatory cell intensity having a set of four values and having an average value giving the subcell intensity; a step of providing first to fourth transparent mask substrate; a step of setting mask cells, corresponding to the cells, in rows and columns by demarcating with a plurality of straight lines orthogonal to each other at an equal interval, on a surface of each of the first to fourth mask substrates; a step of setting sub-mask-cells corresponding to the subcells by a plurality of virtual divisional lines drawn in row and column directions and setting an on-mask reference point, on the surface of each of the first to fourth mask substrates; a step of aligning the on-mask reference point of the first mask substrate with the coordinate origin; a step of aligning the on-mask reference point of the second mask substrate with a position shifted a distance of ½ times the one-side length of the mask cell in a row direction from the coordinate origin; a step of aligning the on-mask reference point of the third mask substrate with a position shifted a distance of ½ times the one-side length of the mask cell in a column direction from the coordinate origin; a step of aligning the on-mask reference point of the fourth mask substrate with a position shifted a distance of ½ times the one-side length of the cell in the row and column directions from the coordinate origin; a step of providing the sub-mask-cells of the first to fourth mask substrates with preparatory cell intensities corresponding to the subcells, in greater order; a step of selecting, as a cell intensity, one of the preparatory cell intensities of the sub-mask-cells belonging to each of the mask cells of the first to fourth mask substrates; a step of setting any one or both of a light-transmission area and a shade area to each of the mask cells of the first to fourth mask substrates, and defining the cell intensity with a light intensity to a corresponding area of the resist through the mask cells by the area ratio of the light-transmission area to the mask cell; a step of forming a shade film over the shade areas of each of the first to fourth mask substrates thereby obtaining first to fourth photomasks; a step of aligning the on-mask reference point of the first photomask with the coordinate origin to perform an exposure; a step of aligning the on-mask reference point of the second photomask with a position shifted a distance of ½ times the one-side length of the mask cell in a row direction from the coordinate origin to perform an exposure; a step of aligning the on-mask reference point of the third photomask with a position shifted a distance of ½ times the one-side length of the mask cell in a column direction from the coordinate origin to perform an exposure; and a step of aligning the on-mask reference point of the fourth photomask with a position shifted a distance of ½ times the one-side length of the mask cell in the row and column directions from the coordinate origin to perform an exposure.

7) A method of forming a resist pattern, upon forming a resist pattern having a film thickness changing on an underlying layer, the method including a step of providing, in a position where to use the photomask, a virtual mask plane having a coordinate origin in a position corresponding to an on-resist reference point set on the resist; a step of setting a plurality of square cells in rows and columns by demarcating the mask plane with a plurality of straight lines orthogonal to each other at an equal interval, each of which has one side having a length provided smaller than a length of a resolution limit of an optical system of an exposure equipment for which the photomask is used; a step of setting $n^2$ subcells by drawing virtual divisional lines in row and column directions and dividing each of the cells into n (n: integer of 2 or greater) equal parts with respect to the row and column directions; a step of setting film thickness of the resist layer for positions corresponding to each of the subcells; a step of setting one of normalized light intensities of light transmitting through the subcells as a subcell intensity, the subcell intensity corresponding to the film thickness, the normalized light intensities having three or more different values in which a maximum value of the light transmitting through the subcells is normalized to 1; a step of setting each of the subcells with a preparatory cell intensity having a set of $n^2$ values and having an average value giving the subcell intensity; a step of providing first to $n^2$-th mask substrates; a step of setting mask cells corresponding to the cells by a plurality of virtual grid lines drawn in row and column directions mutually orthogonal, and setting sub-mask-cells corresponding to the subcells by a plurality of virtual divisional lines drawn in the row and column directions, and setting an on-mask reference point, on the surface of each of the first to $n^2$-th mask substrates; a step of setting the mask cells by shifting the column-directional position at an increment/decrement of P/n from 0 to P/n×(n−1) (P: one-side length of the mask cell), shifting the row-directional position at an increment/decrement of P/n from 0 to P/n×(n−1) relative to the column-directional positions, with each position of which the on-mask reference point of each of the first to $n^2$-th mask substrates is aligned; a step of providing the sub-mask-cells of the first to $n^2$-th mask substrates with preparatory cell intensities corresponding to the subcells, in greater order; a step of selecting, as a cell intensity, one of the preparatory cell intensities of the sub-mask-cells belonging to each of the mask cells; a step of setting any one or both of a light-transmission area and a shade area to each of the mask cells, and defining the cell intensity with a light intensity to a corresponding area of the resist layer through the mask cell by means of an area ratio of the light-transmission area to the mask cell; and a step of forming a shade film over the shade areas of each of the first to $n^2$-th mask substrates thereby obtaining first to $n^2$-th photomasks; and a step of shifting the column-directional position at an increment/decrement of P/n from 0 to P/n×(n−1), shifting the row-directional position at an increment/decrement of P/n from 0 to P/n×(n−1) relative to each of the column-directional positions, with each position of which the on-mask reference point of each of the first to $n^2$-th photomasks is aligned to perform an exposure.

8) A method according to 6) or 7), wherein, in the case, of the mask cells, the mask cells arranged successively in the column direction have the shade areas, the shade areas are continuously provided connected in order in the column direction while in the case, of the mask cells, the mask cells arranged successively in the row direction have the light-transmission and shade areas, the shade areas are provided non-connected in order in the row direction.

9) A method according to 8), wherein, each of the mask cells, set with both of light-transmission and shade areas, is divided into two parts by a virtual divisional line drawn in the column direction, to set the light-transmission area on one side of the virtual divisional line and the shade area on other side thereof, thereby setting the light-transmission areas in the mask cells on same side with respect to the virtual divisional line.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2006-079413 which is hereby incorporated by reference.

What is claimed is:

1. A method of fabricating a photomask for forming a resist pattern by exposing a resist layer provided on an underlying layer to light transmitting through the photomask so that a resist pattern can be formed changing in film thickness on the overlying layer by performing development, the method comprising:

a step of providing, in a position where to use the photomask, a virtual mask plane having a coordinate origin in a position corresponding to an on-resist reference point set on the resist layer;

a step of setting a plurality of square cells in rows and columns by demarcating the mask plane with a plurality of straight lines orthogonal to each other at an equal interval, each of which has one side having a length provided smaller than a length of a resolution limit of an optical system of an exposure equipment for which the photomask is used;

a step of setting four subcells by drawing virtual divisional lines in row and column directions and dividing each of the cells into two equal parts with respect to the row and column directions;

a step of setting film thickness of the resist layer for positions corresponding to each of the subcells;

a step of setting one of normalized light intensities of light transmitting through the subcells as a subcell intensity, the subcell intensity corresponding to the film thickness, the normalized light intensities having three or more different values in which a maximum value of the light transmitting through the subcells is normalized to 1;

a step of setting each of the subcells with a preparatory cell intensity having a set of four values and having an average value giving the subcell intensity;

a step of providing first to fourth transparent mask substrates;

a step of setting mask cells corresponding to the cells in rows and columns by demarcating with a plurality of straight lines orthogonal to each other at an equal interval, on a surface of each of the first to fourth mask substrates;

a step of setting sub-mask-cells corresponding to the subcells by a plurality of virtual divisional lines drawn in row and column directions and setting an on-mask reference point, on the surface of each of the first to fourth mask substrates;

a step of aligning the on-mask reference point of the first mask substrate with the coordinate origin;

a step of aligning the on-mask reference point of the second mask substrate with a position shifted a distance of ½ times the one-side length of the mask cell in a row direction from the coordinate origin;

a step of aligning the on-mask reference point of the third mask substrate with a position shifted a distance of ½ times the one-side length of the mask cell in a column direction from the coordinate origin;

a step of aligning the on-mask reference point of the fourth mask substrate with a position shifted a distance of ½ times the one-side length of the cell in the row and column directions from the coordinate origin;

a step of providing the sub-mask-cells of the first to fourth mask substrates with preparatory cell intensities corresponding to the subcells, in greater order;

a step of selecting one of the preparatory cell intensities of the sub-mask-cells belonging to each of the mask cells of the first to fourth mask substrates;

a step of setting any one or both of a light-transmission area and a shade area to each of the mask cells of the first to fourth mask substrates, and defining the cell intensity with a light intensity through each of the mask cells to a corresponding area of the resist layer; and a step of forming a shade film over the shade areas of each of the first to fourth mask substrates, thereby obtaining first to fourth photomasks.

2. A method according to claim 1, further comprising, in setting any one or both of a light-transmission area and a shade area in each of the mask cells:

a step of obtaining a relationship between an area ratio of the light-transmission area to the mask cell and a resist-film thickness by performing exposure to light and development on the resist layer by use of a test mask having, on a transparent mask substrate, a test pattern having a shade film over the shade areas set with a spacing serving as a light-transmission area in a stripe form at a pitch equal to the one-side length of the mask cell in which the light-transmission and shade areas are changed in width in order, a step of obtaining, for each of the mask cells, the area ratio required to reduce the resist layer to a target film thickness, a step of setting the mask cells on a transparent mask substrate, setting any one or both of the light-transmission and shade areas in the mask cell, and providing a cell intensity with an intensity of light transmitting through each of the mask cells by the area ratio of the light-transmission area to the mask cell, a step of obtaining a temporary photomask by forming a shade film over the shade areas of the mask substrate, a step of measuring a resist-film thickness by performing an exposure by use of the temporary photomask, a step of changing the area ratio on each of the mask cells by use of a comparison result of between a resist-film thickness and a target film thickness.

3. A method according to claim 1, wherein, in the case, of the mask cells, the mask cells arranged successively in the column direction have the shade areas, the shade areas are continuously provided connected in order in the column direction while in the case, of the mask cells, the mask cells arranged successively in the row direction have the light-transmission and shade areas, the shade areas are provided non-connected in order in the row direction.

4. A method according to claim 3, wherein, each of the mask cells, set with both of light-transmission and shade areas, is divided into two parts by a virtual divisional line drawn in the column direction, to set the light-transmission area on one side of the virtual divisional line and the shade area on other side thereof, thereby setting the light-transmission areas in the mask cells on same side with respect to the virtual divisional line.

5. A method according to claim 1, further comprising, in setting any one or both of a light-transmission area and a shade area in each of the mask cells:

a step of obtaining a relationship between an area ratio of the light-transmission area to the mask cell and a resist-film thickness by performing exposure and development on the resist by use of a test mask having, on a transparent substrate, a test pattern having a shade film over the shade areas set with a spacing serving as a light-transmission area in a stripe form at a pitch equal to the one-side length of the mask cell wherein the light-transmission and shade areas are changed in width in order, a step of obtaining, for each of the resist cells, the area ratio required to reduce the resist to a target film thickness, a step of setting the mask cells on a transparent mask substrate, setting any one or both of the light-transmission and shade areas in the mask cell, and providing a cell intensity with an intensity of light transmitting through each of the mask cells by virtue of the area ratio of the light-transmission area to the mask cell, a step of obtaining a temporary photomask by forming a shade film over the shade areas of the mask substrate, a step of measuring a resist-film thickness by performing exposure by use of the temporary photomask, a step of changing the area ratio on each of the mask cells by use of a comparison result of between a resist-film thickness and a target film thickness.

6. A method of fabricating a photomask for forming a resist pattern by exposing a resist layer provided on an underlying layer to light transmitting through the photomask so that a resist pattern can be formed changing in film thickness on the overlying layer by performing development, the method comprising:

a step of providing, in a position where to use the photomask, a virtual mask plane having a coordinate origin in a position corresponding to an on-resist reference point set on the resist layer;

a step of setting a plurality of square cells in rows and columns by demarcating the mask plane with a plurality of straight lines orthogonal to each other at an equal interval, each of which has one side having a length provided smaller than a length of a resolution limit of an optical system of an exposure equipment for which the photomask is used;

a step of setting $n^2$ subcells by drawing virtual divisional lines in row and column directions and dividing each of the cells into n (n: integer of 2 or greater) equal parts with respect to the row and column directions;

a step of setting film thickness of the resist layer for positions corresponding to each of the subcells;

a step of setting one of normalized light intensities of light transmitting through the subcells as a subcell intensity, the subcell intensity corresponding to the film thickness, the normalized light intensities having three or more different values in which a maximum value of the light transmitting through the subcells is normalized to 1;

a step of setting each of the subcells with a preparatory cell intensity having a set of $n^2$ values and having an average value giving the subcell intensity;

a step of providing first to $n^2$-th mask substrates;

a step of setting mask cells corresponding to the cells by a plurality of virtual grid lines drawn in row and column directions mutually orthogonal, and setting sub-mask-cells corresponding to the subcells by a plurality of virtual divisional lines drawn in the row and column directions, and setting an on-mask reference point, on the surface of each of the first to $n^2$-th mask substrates;

a step of setting the mask cells by shifting the column-directional position in increments/decrements of P/n from 0 to P/n×(n−1) (P: one-side length of the mask cell), shifting the row-directional position in increments/decrements of P/n from 0 to P/n×(n−1) relative to the column-directional position, with each position of which the on-mask reference point of each of the first to $n^2$-th mask substrates is aligned;

a step of providing the sub-mask-cells of the first to $n^2$-th mask substrates with preparatory cell intensities corresponding to the subcells, in greater order;

a step of selecting, as a cell intensity, one of the preparatory cell intensities of the sub-mask-cells belonging to each of the mask cells;

a step of setting any one or both of a light-transmission area and a shade area to each of the mask cells, and defining the cell intensity with a light intensity to a corresponding area of the resist layer through each of the mask cells by means of an area ratio of the light-transmission area to the mask cell; and a step of forming a shade film over the shade areas of each of the first to $n^2$-th mask substrates, thereby obtaining first to $n^2$-th photomasks.

7. A method according to claim 6, further comprising, in setting any one or both of a light-transmission area and a shade area in each of the mask cells:

a step of obtaining a relationship between an area ratio of the light-transmission area to the mask cell and a resist-film thickness by performing exposure to light and development on the resist layer by use of a test mask having, on a transparent mask substrate, a test pattern having a shade film over the shade areas set with a spacing serving as a light-transmission area in a stripe form at a pitch equal to the one-side length of the mask cell in which the light-transmission and shade areas are changed in width in order, a step of obtaining, for each of the mask cells, the area ratio required to reduce the resist layer to a target film thickness, a step of setting the mask cells on a transparent mask substrate, setting any one or both of the light-transmission and shade areas in the mask cell, and providing a cell intensity with an intensity of light transmitting through each of the mask cells by the area ratio of the light-transmission area to the mask cell, a step of obtaining a temporary photomask by forming a shade film over the shade areas of the mask substrate, a step of measuring a resist-film thickness by performing an exposure by use of the temporary photomask, a step of changing the area ratio on each of the mask, cells by use of a comparison result of between a resist-film thickness and a target film thickness.

8. A method according to claim 6, wherein, in the case, of the mask cells, the mask cells arranged successively in the column direction have the shade areas, the shade areas are continuously provided connected in order in the column direction while in the case, of the mask cells, the mask cells arranged successively in the row direction have the light-transmission and shade areas, the shade areas are provided non-connected in order in the row direction.

9. A method according to claim 8, wherein, each of the mask cells, set with both of light-transmission and shade areas, is divided into two parts by a virtual divisional line drawn in the column direction, to set the light-transmission area on one side of the virtual divisional line and the shade area on other side thereof, thereby setting the light-transmission areas in the mask cells on same side with respect to the virtual divisional line.

10. A method according to claim 6, further comprising, in setting any one or both of a light-transmission area and a shade area in each of the mask cells:

a step of obtaining a relationship between an area ratio of the light-transmission area to the mask cell and a resist-film thickness by performing exposure and development on the resist by use of a test mask having, on a transparent substrate, a test pattern having a shade film over the shade areas set with a spacing serving as a light-transmission area in a stripe form at a pitch equal to the one-side length of the mask cell wherein the light-transmission and shade areas are changed in width in order, a step of obtaining, for each of the resist cells, the area ratio required to reduce the resist to a target film thickness, a step of setting the mask cells on a transparent mask substrate, setting any one or both of the light-transmission and shade areas in the mask cell, and providing a cell intensity with an intensity of light transmitting through each of the mask cells by virtue of the area ratio of the light-transmission area to the mask cell, a step of obtaining a temporary photomask by forming a shade film over the shade areas of the mask substrate, a step of measuring a resist-film thickness by performing exposure by use of the temporary photomask, a step of changing the area ratio on each of the mask cells by use of a comparison result of between a resist-film thickness and a target film thickness.

* * * * *